United States Patent
Eida et al.

(10) Patent No.: US 6,633,121 B2
(45) Date of Patent: Oct. 14, 2003

(54) ORGANIC ELECTROLUMINESCENCE DISPLAY DEVICE AND METHOD OF MANUFACTURING SAME

(75) Inventors: Mitsuru Eida, Sodegaura (JP); Hiroshi Tokailin, Sodegaura (JP); Yoshikazu Nagasaki, Sodegaura (JP); Toshio Sakai, Sodegaura (JP)

(73) Assignee: Idemitsu Kosan Co., Ltd. (JP)

( * ) Notice: Subject to any disclaimer, the term of this patent is extended or adjusted under 35 U.S.C. 154(b) by 225 days.

(21) Appl. No.: 09/767,018

(22) Filed: Jan. 23, 2001

(65) Prior Publication Data

US 2001/0050532 A1 Dec. 13, 2001

(30) Foreign Application Priority Data

Jan. 31, 2000 (JP) ........................................ 2000-023160

(51) Int. Cl.⁷ .......................... H05B 33/04; H05B 33/14
(52) U.S. Cl. .......................... 313/504; 313/512; 445/24
(58) Field of Search .............................. 313/504, 512; 445/24

(56) References Cited

U.S. PATENT DOCUMENTS

| | | | | |
|---|---|---|---|---|
| 5,909,081 A | * | 6/1999 | Eida et al. | 313/504 |
| 6,049,167 A | * | 4/2000 | Onitsuka et al. | 313/512 |
| 6,339,288 B1 | * | 1/2002 | Qian et al. | 313/504 X |
| 6,432,516 B1 | | 8/2002 | Terasaki et al. | 428/195 |

FOREIGN PATENT DOCUMENTS

| | | | |
|---|---|---|---|
| JP | 07-014675 | | 1/1995 |
| JP | 09-148066 | | 6/1997 |
| JP | 10-116687 | | 5/1998 |
| JP | 10-335061 | | 12/1998 |
| JP | 11-026156 | | 1/1999 |
| JP | 11-040358 | | 2/1999 |
| JP | 11-054270 | | 2/1999 |
| JP | 11-054285 | | 2/1999 |
| JP | 11-087054 | | 3/1999 |
| JP | 11-126686 | | 5/1999 |
| JP | 2000-30871 | | 1/2000 |
| JP | 2000-133446 | * | 5/2000 |
| JP | 2000-150147 | | 5/2000 |
| TW | 2000-023160 | | 1/2000 |

OTHER PUBLICATIONS

Taiwanese Office Action and Translation thereof.

* cited by examiner

*Primary Examiner*—Fred L Braun
(74) *Attorney, Agent, or Firm*—Parkhurst & Wendel, L.L.P.

(57) ABSTRACT

An organic electroluminescent device including a lower electrode, an organic light-emission medium, and an upper electrode on a support substrate, wherein the water content of the organic light-emission medium does not exceed 0.05 wt. %. By so controlling the water content of the organic light-emission medium, it is possible to prevent shrinkage of a light-emission area based on production of non-emission parts or non-emission spots for a long time at both high temperature and room temperature conditions. A method of making the organic electroluminescent device is disclosed also.

17 Claims, 13 Drawing Sheets

ORGANIC ELECTROLUMINESCENCE DISPLAY DEVICE AND METHOD OF MANUFACTURING SAME

FIELD OF THE INVENTION

This invention relates to an organic electroluminescence device (hereinafter occasionally called as an organic EL device) and its manufacturing method thereof.

BACKGROUND ART

Conventionally, various sealing methods and moisture protecting methods for an electro-luminescence element and an electro-luminescence apparatus comprising an electro-luminescence device and a florescent medium with a combination have been investigated to prevent the bad effect of water in the atmosphere and not to produce the non-emission parts or non-emission spots, which may be sometimes referred to as dark spots.

For example, the organic EL device having a sealing means which covers an organic EL element and a drying agent is disclosed in JP-A-9-148066. Also, the organic EL device having a protective layer made from inorganic materials such as Germanium oxide (GeO) onto the upper electrode for protecting the moisture is disclosed in JP-A-7-14675.

However, with a progress of a high resolution organic EL device and organic EL element, non-emission parts or non-emission spots which width or diameter is several 10 micrometers, are produced around the pixel as shown in FIG. 15, and there is the problem that the brightness decreases as the emitting area shrinks.

In the organic light-emission medium formed by using an ink-jet printing method according to JP-A-11-40358 and JP-A-11-54270, and the organic light-emission medium formed by using a micelle disruption method according to JP-A-11-87054, many non-emission parts or non-emission spots are remarkably produced with a comparison of the organic light-emission medium formed by using a deposition method. Also, it is difficult to prevent efficiently the production of the non-emission parts or non-emission spots by the conventional sealing means or the moisture proofing techniques.

So that, the present inventors have studied the prior arts problems, have found that the water contained in both of the planarizing layer and the intermediate insulating layer migrates to the organic light-emission medium or the upper electrode and gives much worse effect of the oxidation of them than the water which invades from the outside as theoretically shown in FIGS. 16 and 17, and have proposed the organic EL device having the good durability by improving such water problems.

For example, the organic EL device having a planarizing layer which water content is 1.0 wt. % or less between a florescent medium and a lower electrode is proposed in JP-A-11-26156. Also, the organic EL device having an intermediate insulating layer comprising a drying agent inside to keep the water content of 0.1 wt. % or less is proposed in JP-A-11-54285.

However, in the organic EL devices according to JP-A-11-26156 and JP-A-11-54285, although it is possible to prevent the production of non-emission area or non-emission part in some extent during the storing at the room condition, but it is difficult to prevent the production of non-emission area or non-emission part and the shrinkage of the emitting area during the storing at the high-temperature condition such as 80° C., and to obtain the high brightness for a long time.

Thus, the inventors have keen studied these problems and have found that there is the critical relationship between the water content of the organic light-emission medium after fabricating the organic EL device and the production of non-emission area or non-emission part and the shrinkage of the emitting area and such production of non-emission area or non-emission part around the pixels are remarkably prevented by keeping the water content below the predetermined value.

The object of the present invention is to provide the organic EL device which can prevent the production of non-emission area or non-emission part, even if the pixel area becomes high resolution (for example, size of 100 $\mu$m×300 $\mu$m square), the organic light-emission medium is formed by the wetting process (for example, coating process) or it is stored for a long time at the high-temperature condition (for example, 80° C., 2 weeks).

Thus, it is the object to provide the organic EL device having the good heat resistance and the long life brightness property and its manufacturing method thereof.

DISCLOSURE OF THE INVENTION

One embodiment of the present invention is an organic EL device comprising a lower electrode, an organic light-emission medium and an upper electrode (opposite electrode) on a support substrate, wherein a water content of the organic light-emission medium is 0.05 wt. % or less. Thus, the above-mentioned problems can be solved.

Namely, by constituting the organic EL device like this, it is possible to prevent the oxidation of the upper electrode (opposite electrode) based on the water that is included in a light-emission medium. Thus, the shrinkage of the light-emission area and the decrease of the luminescence brightness can be prevented for a long time at the high temperature condition as well as the room condition.

Another embodiment of the present invention is an organic EL device comprising a lower electrode, an intermediate insulating layer (sometimes called as an electrically insulating layer), an organic light-emission medium and an upper electrode (opposite electrode) on a support substrate, wherein a water content of the intermediate insulating layer and the organic light-emission medium is 0.05 wt. % or less.

By constituting the organic EL device like this, it is possible to provide the fine pitch matrix of the electrodes since the good electrically insulation between the lower electrode and the upper electrode are obtained. In addition, the shrinkage of the light-emission area and the decrease of the luminescence brightness can be prevented for a long time at the high temperature condition such as 80° C. as well as the room condition.

Note that, as a modification of the above-described organic EL device, it is also favorable to provide both or each of a color filter and a florescence medium on the opposite side of the upper electrode (opposite electrode) having a light-emission medium, a planarizing layer, or a sealing member and the like.

A further embodiment of the present invention is an organic EL device comprising each or both of a color filter and a florescence medium, a lower electrode, an intermediate insulating layer, an organic light-emission medium and an upper electrode (opposite electrode) on a support substrate, wherein a water content of the each or both of the color filter and the florescence medium, the intermediate insulating layer and the organic light-emission medium is 0.05 wt. % or less.

By constituting the organic EL device like this, a multi-color display may be easily obtained and the shrinkage of the light-emission area based on the production of non-emission area or non-emission part can be prevented for a long time at the high temperature condition such as 80° C.

A further embodiment of the present invention is an organic EL device comprising the each or both of a color filter and a florescence medium, a planarizing layer, a lower electrode, an intermediate insulating layer, an organic light-emission medium and an upper electrode (opposite electrode) on a support substrate, wherein a water content of the each or both of the color filter and the florescence medium, the planarizing layer, the intermediate insulating layer and the organic light-emission medium and is 0.05 wt. % or less.

By constituting the organic EL device like this, a multi-color display may be easily obtained and the preventing of the short-circuiting based on the roughness of a florescence medium and the like becomes easy. In addition, the shrinkage of the light-emission area based on the production of non-emission area or non-emission part can be prevented for a long time at the high temperature condition such as 80° C. further embodiment of the present invention is a method for manufacturing an organic EL device comprising a lower electrode, an organic light-emission medium and an upper electrode (opposite electrode) on a support substrate, wherein a drying step is carried out before and after forming of the organic light-emission medium or each occasion in order to keep that a water content of the organic light-emission medium after fabricating the organic EL device is 0.05 wt. % or less.

By carrying out the method like this, it is possible efficiently to provide an organic EL device which can prevent the shrinkage of the light-emission area based on the production of non-emission area or non-emission part for a long time at the high temperature condition such as 80° C. In a method for manufacturing an organic EL device according to the present invention, it is favorable that the dew point at the drying step is maintained at −10° C. or less.

By carrying out the method like this, it is possible to dry the water in a short time by using a simple apparatus.

In a method for manufacturing an organic EL device according to the present invention, it is favorable that the evacuated pressure at the drying step is 13.3 Pa (0.1 Torr) or less.

By carrying out the method like this, it is possible to dry the water in a short time by using a simple apparatus.

In a method for manufacturing an organic EL device according to the present invention, it is favorable that the heating temperature at the drying step is from 60 to 300° C.

By carrying out the method like this, it is possible to dry the water in a short time by using a simple apparatus.

In a method for manufacturing an organic EL device according to the present invention, it is favorable that an inert gas is used at the drying step.

By carrying out the method like this, it is possible to dry the water in a short time without oxidizing a light-emission medium and electrodes.

A further embodiment of the present invention is a method for manufacturing an organic EL device wherein an apparatus comprising a drying unit, a deposition unit and a conveying unit between these units is used, the drying step for a substrate is carried out before and after forming of the organic light-emission medium or each occasion in the drying unit, the conveying step of the substrate to the deposition unit is carried out by using a conveyer in the conveying unit, and the forming step of an organic light-emission medium is carried out in the deposition unit.

By carrying out the method like this, it is possible to dry the water efficiently in a light-emission medium after fabricating the organic EL device.

A further embodiment of the present invention is a method for manufacturing an organic EL device wherein an electroluminescence element comprising a lower electrode, an organic light-emission medium and an upper electrode on a support substrate, and sealing parts having each or both of a color filter and fluorescence medium on a sealing substrate are laminated, wherein a drying step is carried out for at least the organic light-emission medium and the sealing parts in order to keep that a water content of the organic light-emission medium after fabricating the organic EL device is 0.05 wt. % or less.

By carrying out the method like this, it is possible to provide an organic EL device having a color display efficiently. In addition, it is possible to provide the organic EL device that can prevent the shrinkage of the light-emission area based on the production of non-emission area or non-emission part for a long time, even if a fluorescence medium is formed on the side of a sealing substrate.

A further embodiment of the present invention is a method for manufacturing an organic EL device comprising a lower electrode, an organic light-emission medium and an upper electrode (opposite electrode) on a support substrate, wherein a drying step is carried out after forming of the organic light-emission medium by using a wetting process in order to keep that a water content of the organic light-emission medium after fabricating the organic EL device is 0.05 wt. % or less.

By carrying out the method like this, it is possible to provide the organic EL device, which can prevent the shrinkage of the light-emission area based on the production of non-emission area or non-emission part for a long time without oxidizing a light-emission medium and an opposite electrode, even if using a wetting process forms a light-emission medium.

A further embodiment of the present invention is a method for manufacturing an organic EL device, wherein an apparatus comprising a drying unit, a deposition unit and a conveying unit between these units is used, the organic light-emission medium is formed by using a wetting process, the drying step for a substrate is carried out after a formation of the organic light-emission medium in the drying unit, the conveying step of the substrate to the deposition unit is carried out by using a conveyer in the conveying unit, and the forming step of an upper electrode is carried out in the deposition unit.

By carrying out the method like this, it is possible to efficiently dry the water in a light-emission medium after fabricating the organic EL device.

BRIEF DESCRIPTION OF THE DRWAINGS

BEST MODE FOR CARRYING OUT THE INVENTION

Figure 1:
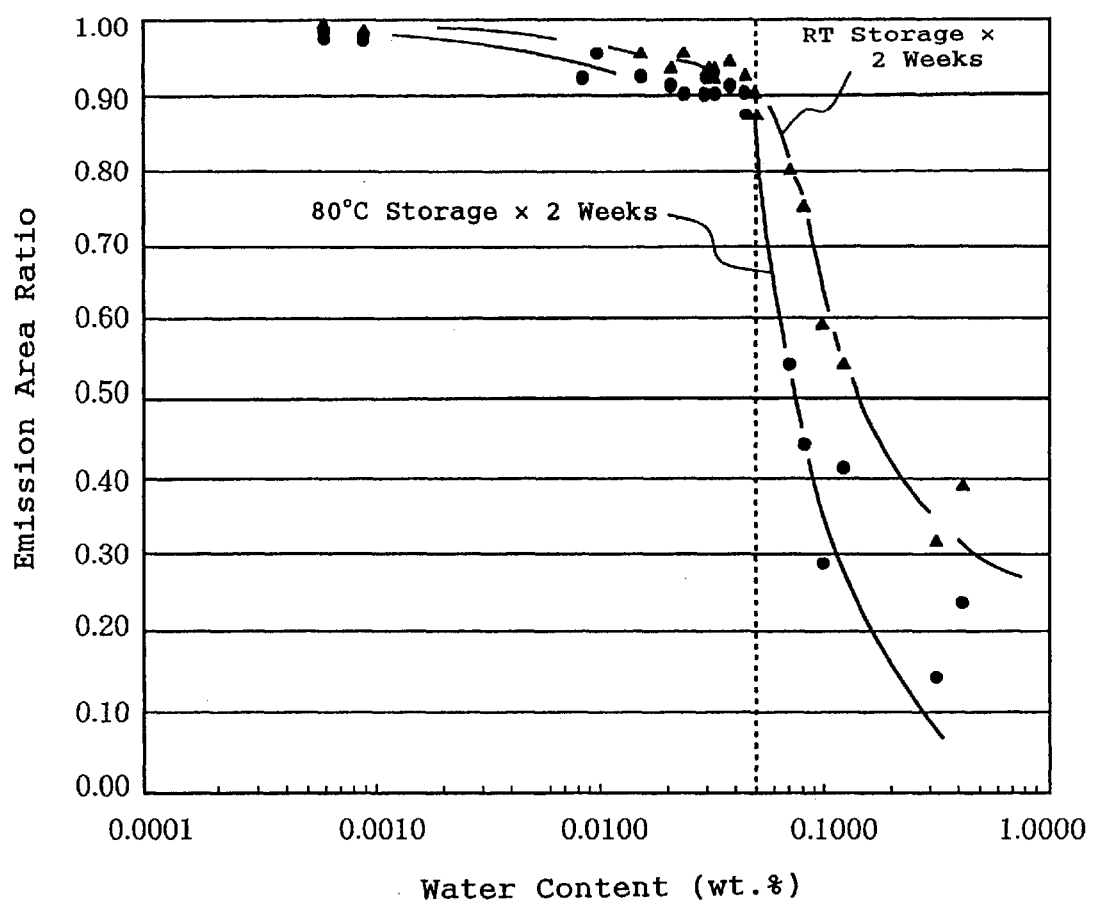
FIG. 1 is a drawing showing a relationship between the water content of an organic light-emission medium and the emission area.

The best mode for carrying out the invention will now be described specifically with references to the accompanying drawings. The drawings schematically show the sizes, shapes, and positional relationships of the components to assist understanding of the present invention. Accordingly, the present invention shall not be limited to the embodiments shown in the drawings. Also, hatching to indicate sections is sometimes omitted in the drawing.

[First Embodiment]

Figure 3:
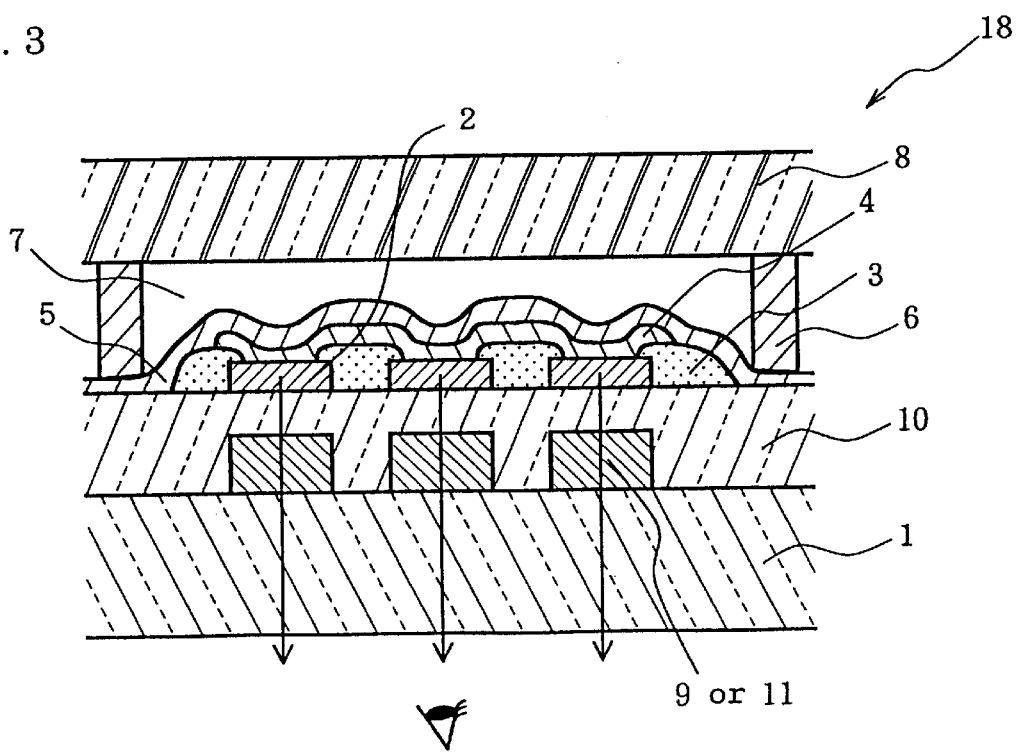
FIG. 3 is a drawing showing a sectional view of an organic EL device (No. 2).

As shown in FIG. 3, the organic EL device of the first embodiment is constructed with a supporting substrate 1, a fluorescent medium 9 (or a color filter 11), a planarizing layer 10, an intermediate insulating layer 3, a lower electrode 2, an organic light-emission medium 4, an opposite electrode (upper electrode) 5, and a sealing glass 8. Both or each of the fluorescent medium 9 and the color filter 11 are favorably provided with the organic EL device.

In the first embodiment, as the water content of the organic light-emission medium 4 (or the mixture of the organic light-emission medium 4, the fluorescent medium 9 (or the color filter 11), the planarizing layer 10, and the intermediate insulating layer 3) is 0.05 wt. % or less, the production of non-emission area or non-emission part and the shrinkage of light-emission area may be prevented, even if the pixel is high resolution or the organic EL device is driven at the high-temperature condition.

By occasionally referring to FIG. 3, the components of the organic EL device based on the first embodiment, its water content and the like will be explained as below.

(1) Organic Light-emission Medium (1)-1 Constitution

An organic light-emission medium is defined as a medium comprising an organic light-emission part that can emit an EL light by combining an electron and a hole. Such organic light-emission medium may be constructed by forming the following layers on an anode, for example.
(i) Organic light-emission layer
(ii) Hole injection layer/Organic light-emission layer
(iii) Organic light-emission layer/electron injection layer
(iv) Hole injection layer/Organic light-emission layer/ electron injection layer
(v) Organic semiconductor layer/Organic light-emission layer
(vi) Organic semiconductor layer/Electron barrier layer/ Organic light-emission layer
(vii) Hole injection layer/Organic light-emission layer/ attaching modification layer.

Among them, the constitution (iv) is favorably adopted in the present invention since the high brightness and durability are easily obtainable.

(1)-2 Function and Kind

The organic light-emission material used for the composing material of the organic light-emission layer preferably provides the following three functions in combination.
(a) Electric charge injection function: A function for injecting electrons from the cathode or the electron injection layer while electron holes are able to be injected from the anode or electron hole injecting layer when the electrical field is applied.
(b) Transportation function: A function for moving injected electron holes and electrons by the force of the electrical field.
(c) Light-emission function: A function for providing a field for re-combining electrons with electron holes and for allowing these to emit light.

Thus, the organic light-emission compounds having such functions are given as one or more following compounds; p-quaterphenyl derivatives, p-quinque-phenyl derivatives, benzothiazole type compounds, benzoimidazole type compounds, benzooxazole type compounds, metal chelated oxinoid compounds, oxadiazole compounds, styryl benzene type compounds, distyryl pyrazine derivatives, butadiene type compounds, naphthalimide compounds, perylene derivatives, aldazine derivatives, pyrazine derivatives, cyclopentadiene derivatives, pyrrolopyrrole derivatives, styrylamine derivatives, coumarine type derivatives, aromatic dimethylidene type derivatives, metal complex having a ligand of 8-quinolinol derivatives, polypenyl type derivatives and the like.

Among these organic light-emission materials, as the aromatic methylidene compound, 4,4'-bis(2,2-di-tert-butylphenylvinyl)biphenyl (DTBPBBi), 4,4'-bis(2,2-diphenylvinyl) biphenyl (DPVBi) and their derivatives are more favorable.

It is also suitable to use the material in combination, in which the organic light-emission material having a distyryl arylene skeleton is used as a host material and the strong fluorescent dyes from blue to red, as a dopant material, for example, coumarin-based fluorescent dyes, or the dyes similar to the host material which is doped to the host material.

More concretely, it is favorable to use the above-mentioned DPVBi as a host material and N,N-diphenylaminobenzene (DPAVB) as a dopant.

Also, the above-mentioned organic light-emission material may be chosen depending on the desired EL color. For example, if the light from ultraviolet to violet is desired, it is suitable to use the p-quaterphenyl derivatives and the like. If the light from blue to green is desired, it is suitable to use the styryl benzene type compounds and the like. If the white light is desired, it is suitable to laminate the red fluorescent layer on the blue light-emission layer and green light-emission layer based on the suitable selection of the organic light-emission materials.

Note that it is also favorable to include later-described fluorescent materials used in the fluorescent layer, dyes and organic pigments in the organic light-emission medium.

In addition, it is favorable to use the organic light-emission medium having the low average number molecular weight of less than 10,000 which was measured by gel permeation chromatography (GPC) since the vacuum deposition method or the sputtering method is easily available. On the contrary, it is favorable to use the organic light-emission medium having the high average number molecular weight of 10,000 or more when the spin-coater or ink-jet printing apparatus are used to form the uniform wetting layer. Such high molecular weight material are polyarylenevinylene, polyarylenevinylene derivative (such as PPV), polyfluorene, polyfluorene derivative, copolymer containing fluorene, and the like.

On the contrary, it is favorable to use the hole injection compound having a hole mobility of at least $1 \times 10^{-6}$ cm$^2$/v.sec and ionization potential of 5.5 eV or less when an electric field of $1 \times 10^4 - 1 \times 10^6$ v/cm is applied. By providing such hole injection layer, good hole injection property to the organic light-emission layer, high brightness and low-potential drive are obtainable.

These hole injection compounds concretely illustrates porphyrin compounds, aromatic tertiary amines, styrylamine compounds, aromatic dimetylidine compounds, aromatic condensed ring compounds such as 4,4'-bis[N-(1-naphtyl)-N-phenylamino]biphenyl (NPD) and 4,4',4"-tris[N-(3-metylphenyl)-N-phenylamino]triphenylamine (MTDATA). Also, the hole injection compounds illustrates an inorganic material such as p-Si and p-SiC.

Note that it is favorable to provide an organic semiconductor layer having a conductivity of at least $1 \times 10^{-10}$ S/cm between the above-described hole injection layer and the anode or the above-described hole injection layer and the light-emission layer. By providing such organic semiconductor layer, more excellent hole injection property to the organic light-emission layer are obtainable.

Also, it is favorable to use the electron injection compound having an electron mobility of at least $1 \times 10^{-6}$ cm$^2$/v.sec and ionization potential of more than 5.5 eV when an electric field of $1 \times 10^4$ to $1 \times 10^6$ v/cm is applied. By providing such electron injection layer, good electron injection property to the organic light-emission layer, high brightness and low-potential drive are obtainable.

These electron injection compounds concretely illustrates metal complex of 8-hydroxyquinoline (Aluminum chelate compound: Alq), its derivative, and oxadiazole derivatives.

Also, the attaching modification layer is recognized to be a part of the above-described electron injection. Thus, the attaching modification layer is a layer showing the good adhesion to the cathode and is favorably composed of the metal complex of 8-hydroxyquinoline or its derivative.

Note that it is favorable to provide an organic semiconductor layer having a conductivity of at least $1 \times 10^{-10}$ s/cm next to the above-described electron injection layer. By providing such organic semiconductor layer, more excellent electron injection property to the organic light-emission layer are obtainable.

(1)-3 Film Thickness

There is no particular limitation to a film thickness of an organic light-emission layer, and any film thickness may be chosen as required in accordance with conditions. However, specifically, it is preferable that the film thickness is within the range of 5 nm to 5 $\mu$m. This is because when the film thickness of the organic light-emission layer becomes less than 5 nm, the luminance brightness or durability may be lowered, whereas when the film thickness of the organic light-emission layer exceeds 5 $\mu$m, the value of voltage applied may be increased.

Accordingly, since better balance is achieved between the luminance brightness, the applied voltage value, and the like, it is more preferable to keep the film thickness of the organic light-emission layer between 10 nm and 3 $\mu$m, and more suitably between 20 nm and 1 $\mu$m.

(1)-4 Water Content

In the first embodiment, the water content (W) defined by the equation (1) should be 0.05% or less to prevent the non-emission area and non-emission spot.

In addition, the water content is favorably in a range of 0.0001 to 0.04 wt. %, more favorably in a range of 0.0001 to 0.03 wt. %, and more further favorably in a range of 0.0001 to 0.01 wt. % to prevent the non-emission area and non-emission spot at the high temperature condition as well as not to cause the shrinkage of the emitting-area with high resolution pixel.

$$W = \{(\text{Weight } A - \text{Weight } B)/\text{Weight } B\} \times 100 \qquad (1)$$

Weight A: Weight (mg) of the organic light-emission medium of the organic EL device which is sampled in the dried condition (for example drying box or drying gas) without invasion of the water from the outside and which is measured by using an automatic water adsorption and desorption measuring apparatus (with a precise balance)

Weight B: Weight (mg) of the organic light-emission medium which is heated (for example, 80° C. for 30 minutes) in the drying box or drying gas and which is measured by using an automatic water adsorption and desorption measuring apparatus.

Namely, Weight B is the reduced weight by removing the water from organic light-emission medium.

Figure 18:
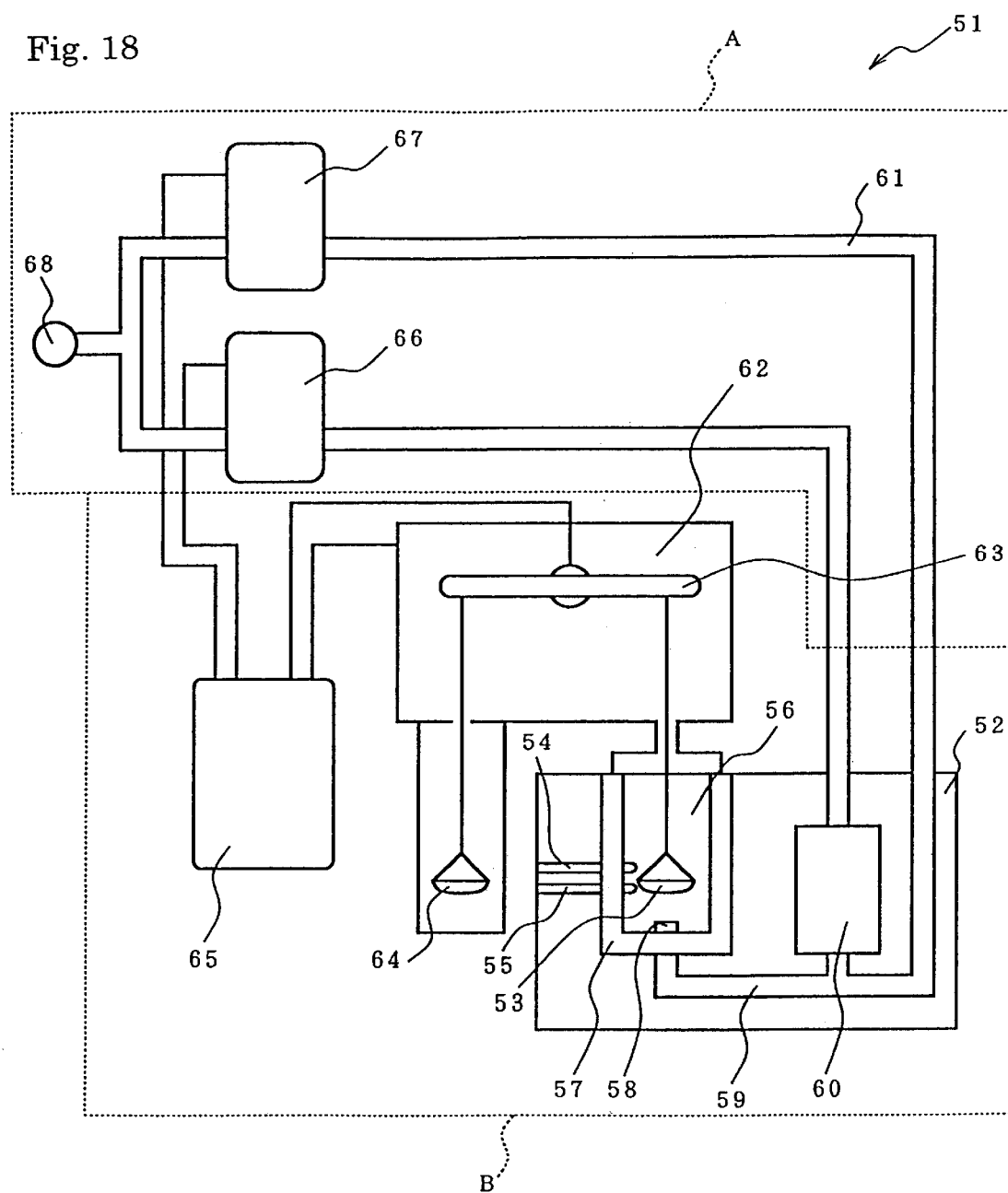
FIG. 18 is a diagram for explaining an automatic water absorption measuring apparatus.
Figure 19:
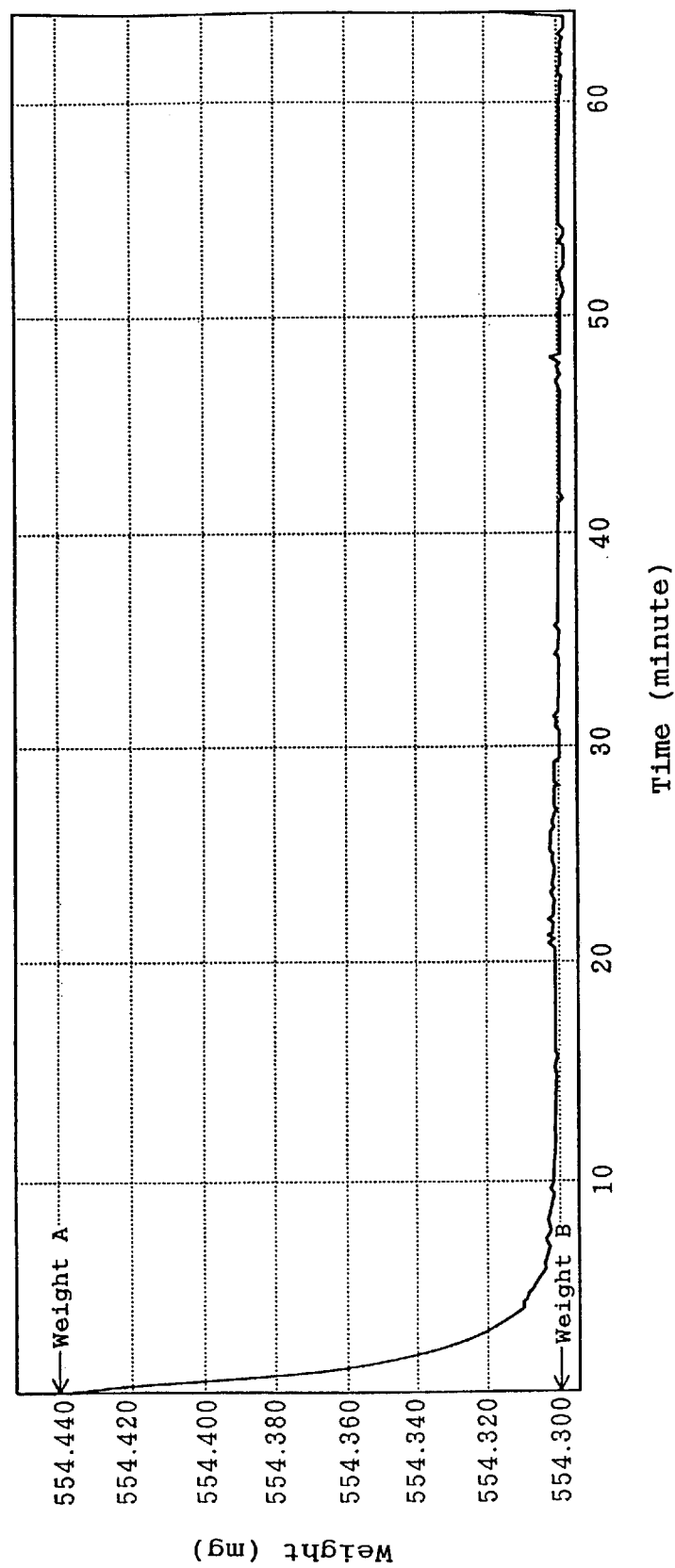
FIG. 19 is a water chart measured by an automatic water absorption measuring apparatus as shown in FIG. 18.

Here, the automatic water absorption measuring apparatus will be shortly explained by referring to FIGS. 18 and 19.

FIG. 18 shows one of the automatic water adsorption and desorption measuring apparatus 51 which is constructed by a circulation part A and a water measuring part B which are separated each other by the dotted line in the FIG. 18. Circulation part A is constructed by a gas storage part 68, a drying gas circulation device 67 and a wet-gas circulation device 66 which are divided in two directions from the gas storage part 68, and the circulation route 61 which connects these circulation devices 66, 67 and the water measuring part B. These circulation devices 66, 67 are remote-controlled with a regulation part 65 included in the water measuring part B.

On the other hand, the water measuring part B is constructed by a regulation part 65, a balance part 62, a reference sample part (including a reference plate) 64, a drying box 56, an oil-bath 52 and the like.

Also, a heating device 57 is provided around the drying box 56 and a temperature sensor 54 to monitor the temperature of the drying box 56 near the balance 53 for placing the sample and a moisture sensor 55 to monitor the moisture of the drying box 56.

According to thus constituted automatic water adsorption and desorption measuring device 51, it is possible to maintain the determined temperature and the moisture of the drying gas by passing the drying gas from the circulation part A into the oil bath 52 and to maintain the determined temperature and the moisture of the drying box 56 by introducing such drying gas into the drying box 56 through an inlet 58 and by heating the drying box 56 with the heating device 57. And the weight of the sample placed on the balance 53 is able to be measured with the precise balance by comparing with the comparative weight (reference) in the reference part 64.

FIG. 19 shows the weight chart obtained by measuring which horizontal axis stands for the elapsed time (minutes) and which vertical axis stands for the sample weight (g). For this measuring example in the condition that the moisture in the drying box is kept at 0%, weight A is 554.440 mg and weight B is 554.300 mg.

Weight A and weight B are favorably measured by a precise balance provided with an automatic water absorption measuring apparatus, but the water content based on their weights can be measured by the method according to ASTM D570-63, thermal analysis (Differential Thermal Analysis, Differential Scanning Calorie meter), and Karl Fischer's method.

Also, there is the case where it is difficult to distinguish the organic light-emission medium from the other organic layers since an intermediate insulating layer, a planarizing layer, a fluorescent medium and a color filter are around the organic light-emission medium. If so, it is enough to measure the weights A and B of the mixture of the organic light-emission medium and the other organic layers. This is because it is confirmed in the other experimental that to keep the water content of the mixture 0.05 wt. % or less can efficiently prevent the shrinkage of the emitting area. The water of thus measured water content is diffused without being partially localized, and invades into the organic light-emission medium to be the cause of the oxidation of the organic light-emission medium and the opposite electrode as well as the equilibrium condition.

Therefore, even if the mixture of the organic light-emission medium, the intermediate insulating layer and the like are sampled, their water content of them can be recognized to be identical with the water content of the organic light-emission medium. If the water content of the mixture is 0.05 wt. % or less, the water content of the organic light-emission medium is recognized to be the same level, namely 0.05 wt. % or less.

Thus, if there is the intermediate insulating layer around the organic light-emission medium, it is enough to sample the mixture of the organic light-emission medium and the intermediate insulating layer and to measure weight A and weight B to calculate the water content of them below 0.05 wt. % or less.

Hereinafter, the reason why the water content of the organic light-emission medium should be 0.05 wt. % or less, will be explained by referring to FIG. 1. FIG. 1 shows the relationship between the organic light-emission medium (partially including other organic layer) and the area ratio based on the production of the non-emission area and non-emission spot. The horizontal axis indicates the water content of the organic light-emission medium (wt. %) and the vertical axis indicates the emission area ratio (emitting area after producing the non-emission area and non-emission spot/emitting area before producing the non-emission area and non-emission spot or the emitting area soon after the organic EL device was fabricated).

In FIG. 1, the symbol (●) indicates the emission area ratio after elapsing the organic EL device in the constant temperature oven at 80° C. for 2 weeks, and the other symbol (▲) indicates the emission area ratio after elapsing the organic EL device at the room condition (25° C.) for 2 weeks in the atmosphere.

As understood from FIG. 1, the less the water content of the organic light-emission medium is, the bigger the size of the emitting area becomes. On the other hand, the more the water content of the organic light-emission medium is, the smaller the size of the emitting area becomes.

However, the ratio of the emission area does not proportionally vary with the water content of the organic light-emission medium. If such water content is beyond 0.05 wt. %, there is a phenomenon that the ratio of the emitting area remarkably decreases. Thus, to keep the water content of the organic light-emission medium at the level of 0.05 wt. % or less which is critical value can prevent the shrinkage of the light-emission area. In other words, it is possible to prevent the production of the non-emission area and non-emission while maintaining the high brightness for a long time.

In the same water content level, there is the tendency that the area ratio after 2 weeks in the high temperature oven at 80° C. becomes smaller in comparing with the area ratio after 2 weeks at room temperature (25° C.). However, in the case where the water content is beyond 0.05 wt. %, there is the tendency that the area ratio remarkably decreases at the both conditions.

In other words, if the water content of the organic light-emission medium is kept at the level of 0.05 wt. % or less, it is possible efficiently to prevent the production of the non-emission area and non-emission even after 2 weeks in the high temperature oven at 80° C. as well as after 2 weeks at room temperature (25° C.). Thus, it is very advantageous to keep the water content at the level of 0.05 wt. % or less in the case where the organic EL device is used in the high temperature condition.

(1)-5 Forming Method

The method for forming the organic light-emission layer is not particularly limited, but, for example, a vacuum deposition method, a spin-coating method, a casting method, a LB (Langmuir-Blodgett) method, a sputtering method, an ink-jet method and a micelle disruption method which are publicly known may be used.

(2) Electrode (2)-1 Anode

As an anode which is corresponding to a lower electrode or an opposite electrode according to the constitution of the organic EL device, an electrode material made of a metal, an alloy, and an electroconductive compound, and a mixture of two or more of these having a large work function (higher than 4 eV) is preferably used.

As concrete examples of such an electrode material are indium tin oxide (ITO), indium zinc oxide (IZO), Strontium Cupper oxide ($SrCu_2O_2$), tin oxide ($SnO_2$), zinc oxide (ZnO), Au, Pt, Pd and the like may be used solely or in the combination of two or more of these electrode materials.

The anode can be prepared by forming a thin coat of these electrode materials by the drying method such as a deposition method, a sputtering method, an ion plating method, an electron beam deposition method, a Chemical Vapor Deposition (CVD) method, a Metal Organic Chemical Vapor Deposition (MOCVD) method, a Plasma Chemical Vapor Deposition (PCVD) method and the like.

In case the EL light is taken out from the anode, it is necessary that the anode is made from a transparent material such as ITO, IZO, $SrCu_2O_2$, $SnO_2$, and $ZnO_2$. If so, the transmittance of the EL light of the anode is favorably 10% or more.

Although the thickness of the anode depends is not limited, usually the range of 10 nm to 1 $\mu$m, preferably the range of 10 to 200 nm is used. This is because the homogeneous thickness of the anode is obtainable, the transmittance of the EL light is obtainable, and the sheet resistance of the anode becomes 1000 Ω/☐ or less, more favorably 100 Ω/☐ or less.

Figure 5:
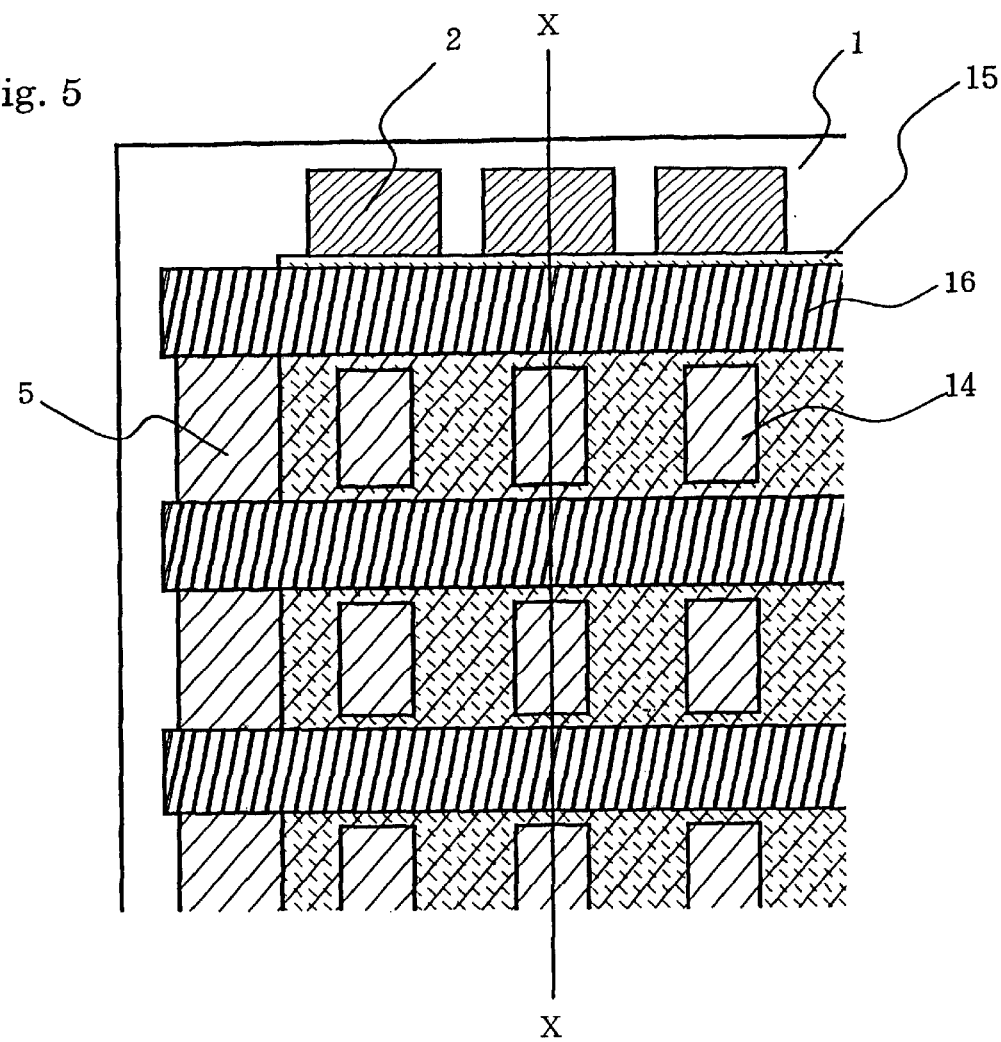
FIG. 5 is a drawing showing a top view of a matrix of the electrodes.
Figure 6:
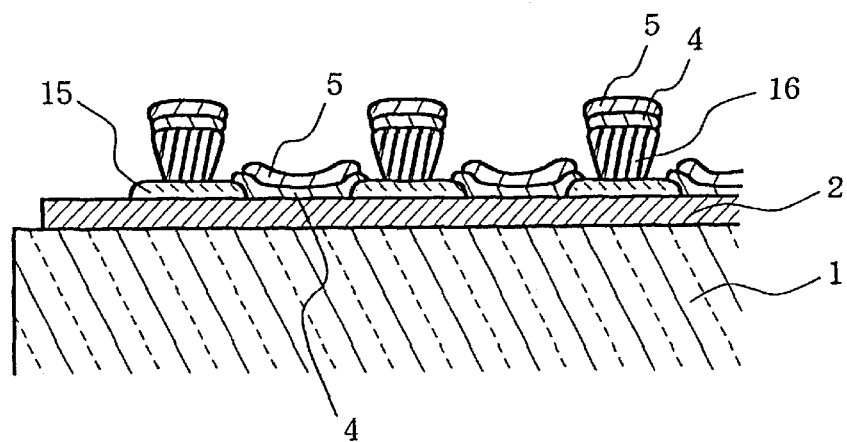
FIG. 6 is a drawing showing a sectional view along the line with X—X of an organic EL device as shown in FIG. 5.

Also, it is favorable to provide an organic light-emission medium between an anode (lower electrode) and a cathode (opposite electrode) which are formed in a matrix as shown in FIGS. 5 and 6, and to emit the pixel optionally. Thus, it is able to display the variety of information on the organic EL devise by constituting the anode and the cathode like this.

Moreover, it is favorable to construct the dot pattern from the anode (lower electrode) and the cathode (opposite electrode) and to provide a switching element such as TFT (Thin Film Transistor) corresponding to each dot pattern. Thus, it is able to display the variety of information on the organic EL devise by emitting the pixels selectively.

(2)-2 Cathode

As the cathode, metals, alloys, and electroconductive compounds having a small work function (smaller than 4 eV), and a mixture of two or more of these are used as an electrode material.

(1) Concretely, sodium, sodium-potassium alloy, cesium, magnesium, lithium, magnesium-silver alloy, aluminum, aluminum oxide, aluminum-lithium alloy, indium, rare earth metal, the mixture of these metals and the organic light-emission medium, and the mixture of these metals and the electroconductive compound are favorably used solely or in the combination of the two or more these electrode materials.

(2) Although the thickness of the cathode is not limited, the favorable range of the thickness is concretely of 10 nm to 1,000 nm, more preferable range is of 10 to 200 nm.

(3) In case the EL light is taken out from the cathode, it is necessary that the cathode should be made as a transparent electrode which transmittance of the EL light is favorably 10% or more.

This cathode may be formed by the drying process such as deposition method and sputtering method in the same manner as an anode.

(3) Support Substrate

A support substrate in the organic EL display device is preferred to be superior in mechanical strength and to be low permeability for water and oxygen stability.

Specific examples of such a substrate include glass substrates, metal plates, ceramic plates, and plastic plates (such as a polycarbonate resin, an acrylic resin, a vinyl chloride resin, a polyethylene terephthalate resin, a polyimide resin, a polyester resin, an epoxy resin, a phenol resin, a silicone resin and a fluoro resin).

In order to avoid the invasion of moisture into the organic EL display device, it is preferred that the substrate made of any one of the above is subjected to moisture-proof treatment or hydrophobic treatment by forming an inorganic film or applying a fluoro resin.

Particularly, in order to avoid the invasion of moisture into the organic luminescence medium, it is preferred to make the water content in the supporting substrate and the gas permeability coefficient thereof small. Specifically, it is preferred to set the water content in the substrate and the gas permeability coefficient to 0.0001% or less by weight and $1 \times 10^{-13}$ cc. cm/cm². sec. cmHg or less, respectively.

(4) Intermediate Insulating Layer (4)-1 Function

An intermediate insulating layer (electrically insulating layer) of the organic EL device according to the present invention is provided around or in the circumference of the organic EL element for enabling the precise construction of the organic EL device, preventing the short-circuiting between the lower electrode and the upper electrode, covering TFT element (Thin film technology) which drives the organic EL device and planarizing the face of the lower electrode of the organic EL device.

Thus, the intermediate insulating layer is sometimes called as a separating wall, a spacer, a planarizing layer depending on the functions and it includes all kinds according to the present invention.

(4)-2 Constitution and Material

As the constitution of the intermediate insulating layer, for example, it is favorably constructed by a first intermediate insulating layer 15 and a second intermediate insulating layer 16 (separating wall) which is provided on the first intermediate insulating layer 15 as shown in FIGS. 5 and 6.

Thus, the intermediate insulating layer is constructed by a first intermediate insulating layer 15 and a second intermediate insulating layer 16 and the organic light-emission medium 4 was provided in a matrix form to produce a pixel 14.

Figure 7:
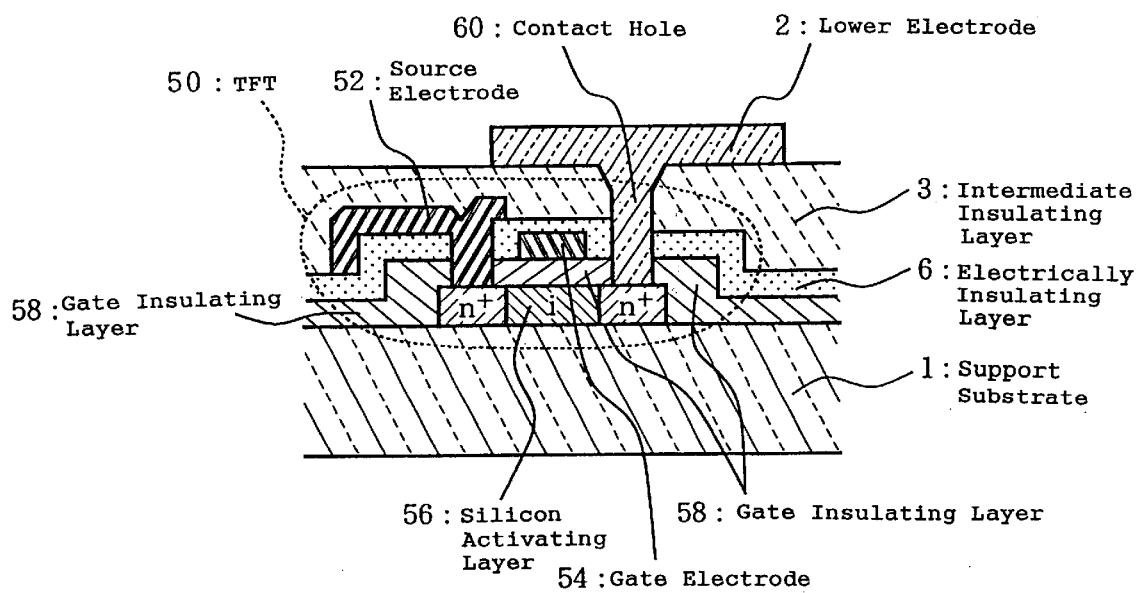
FIG. 7 is a drawing showing a sectional view of a TFT device provided on an organic EL device.

In addition, the intermediate insulating layer 3 a shown in FIG. 7 is provided for protecting the TFT device.

As the material for the intermediate insulating layer, an acrylic resin, a polycarbonate resin, a polyimide resin, a fluorinated polyimide resin, a benzoguanamine resin, a melamine resin, a cyclicpolyolefine resin, a novolac resin, a polyvinyl cinnamate resin, a cyclic rubber, a polyvinylchroride resin, a polystyrene resin, a phenol resin, an alkyd resin, an epoxy resin, a polyurethane resin, a polyester resin, a maleic acid resin, a polyamide resin are usually given. For the high-temperature usage, an acrylic resin, a polyimide resin, a fluorinated polyimide resin, a cyclicpolyolefine resin, and an epoxy resin are favorable.

These intermediate insulating layers are patterned in the optionally shape by using photo-lithography and introducing a photosensitive group into the intermediate insulating layer material or patterned in the optionally shape by using the coating process.

Hereinafter, the constitutions of a first intermediate insulating layer 15 and a second intermediate insulating layer 16 which constructs the intermediate insulating layer are respectively described.

(i) First Intermediate Insulating Layer

It is favorable to form a first intermediate insulating layer by coating a photo-curable resin on the lower electrode having the striped patterns and then forming the first intermediate insulating layer as shown in FIG. 5 with a photo-lithography technology.

Here, although the line and space width of the first intermediate insulating layer and the thickness of the first intermediate insulating layer are depending on the pixel size (emitting area), but favorably the line width is 5 to 200 μm, the space width is 5 to 300 μm, and the thickness is 0.01 to 50 μm.

Also, with regard to electrically insulating property of the first intermediate insulating layer, its volume resistance (potential 1 Mohm, frequency 100 Hz) is favorably at least $1 \times 10^6$ ohm·cm, more favorably in a range of $1 \times 10^8$ to $1 \times 10^{12}$ ohm·cm. Note that the volume resistivity of the later described second intermediate insulating layer is also in the same range as the first intermediate insulating layer.

(ii) Second Intermediate Insulating Layer

It is favorable to form a second intermediate insulating layer by coating a photo-curable resin on the above-described first intermediate insulating layer and then forming the second intermediate insulating layer in such manner that it becomes a separating wall with a photolithography technology.

Also, it is favorable to determine the line and space width of the second intermediate insulating layer and the thickness of the second intermediate insulating layer in considering the configurations of the separating wall, and, for example, the line width is 1 to 150 μm, the space is 10 to 500 μm, and the thickness is 0.5 to 50 μm.

In addition, its sectional form of the second intermediate insulating layer is favorably reverse-trapezoid by controlling an exposing conditions and etching conditions as shown in FIG. 6. By constituting the second intermediate insulating layer like this, it is able to expand the size of the emitting are and to maintain securely the insulating property between the adjoining striped second intermediate insulating layers.

(4)-3 Water Content

In the intermediate insulating layer, the water content is favorable in a range of 0.05% or less like the organic light-emission medium, more favorable in a range of 0.03 wt. % or less, and more further favorable in a range of 0.01 wt. % or less.

This reason is that, if such water content of the intermediate insulating layer exceeds 0.05 wt. %, the included water accelerates the oxidation of the upper electrode and the organic light-emission medium. So that, there is the case where the non-emission parts or non-emission spots are easily produced.

The water content of the intermediate insulating layer is measurable in the same manner as the organic light-emission medium.

(5) Fluorescent Medium (5)-1 Constitution

The fluorescent medium of the organic EL device has the function to absorb the EL light from an organic EL element and to emit the fluorescent light having the longer wave length and has the layer constitutions which are arranged separately in the plane.

Each fluorescent medium is favorably corresponding to the emitting area of an organic EL element, for example, to the crossing point of a lower electrode and an upper electrode. By constituting like this, it is possible to absorb the emitting light from the organic light-emission layer and to take out the different color light having a different wave outside.

Especially, if the organic EL element emits the blue color light and two fluorescent mediums for obtaining the green color light and red color light as well as transmitting the blue color light partially are used, three primary colors such as blue color light, the green color light and red color light are obtainable. Thus, even if one organic EL element is used, the multi-color or full-color display can be available.

Also, it is favorable to provide a shading layer (black matrix) between each fluorescent medium to shade the unwanted light from the organic EL element and each fluorescent medium for improving the contrast and decreasing the independency of the viewing angle.

Note that it is favorable for the fluorescent medium to combine or mix with the later-described color filter to prevent the decreasing of the contrast according to the outside light.

(5)-2 Fluorescent Dye

The fluorescent medium is made from, for example, the mixture of the fluorescent dye and the binder resin or the fluorescent dye alone. And, when the fluorescent medium is made from the mixture of the fluorescent dye and the binder resin, it is obtainable by dissolving or dispersing such fluorescent dye into the pigment resin and/or the binder resin.

Here, the fluorescent dyes which modulate the near-ultraviolet to violet luminescence of an organic EL element to blue luminescence include stilbene-based dyes such as 1,4-bis(2-methylstyryl)benzene (Bis-MSB), trans-4,4'-diphenylstilbene (DRS) and coumarin-based dyes such as 7-hydroxy-4-methylcoumarin (Coumarin 4), and a mixture of two or more of these dyes.

The fluorescent dyes which modulate the blue to blue green luminescence of an organic EL element to green luminescence include coumarin-based dyes such as 2,3,5,6-1H,4H-tetrahydro-8-trifluoromethylquinolizino(9,9a,1-gh)coumarin (Coumarin 153), 3-(2'-benzothiazolyl)-7-diethylaminocoumarin (Coumarin 6), and 3-(2'-benzimidazolyl)-7-N,N-diethylaminocoumarin (Coumarin 7), and naphthalimide-based dyes such as Basic Yellow 51, Solvent Yellow 11, and Solvent Yellow 116, and a mixture of two or more of these dyes.

The fluorescent dyes which modulate the blue to green luminescence of an organic EL element to orange to red luminescence include cyanine-based dyes such as 4-dicyanomethylene-2-methyl-6-(p-dimethylaminostyryl)-4H-pyran (DCM), pyridine-based dyes such as 1-ethyl-2-(4-(p-dimethylaminophenyl)-1,3-butadienyl)-pyridiniumperchlorate (Pyridine 1), Rhodamine-based dyes such as Rhodamine B and Rhodamine 6G, and oxazine-based dyes, and a mixture of two or more of these dyes.

In addition, various dyes (direct dyes, acidic dyes, basic dyes, disperse dyes, or the like) can also be used if they exhibit fluorescent property. Pigments prepared by blending the above-mentioned fluorescent dyes in a pigment resins such as a polymethacrylic acid ester resin, a polyvinylchloride resin, a vinylchloride-vinyl acetate co-polymer, an alkyd resin, an aromatic sulfonamide resin, a urea resin, a melamine resin, and a benzoguanamine resin can be also used.

These fluorescent dyes or fluorescent pigments can be used solely or as a mixture. Also, by appropriately mixing of these fluorescent dyes or fluorescent pigments, it is able to transfer the blue color to blue-green color of the organic EL element to white color.

The concentration of the fluorescence dye in the fluorescence medium including pigments and/or binder resin is depending on the fluorescent dye kinds and it is usually in a range of 1 to $10^{-4}$ mol/kg, favorable in a range of 0.1 to $10^{-3}$ mol/kg, and more favorable in a range of 0.05 to $10^{-2}$ mol/kg.

(5)-3 Binder Resin

For a binder resin, transparent materials having a transmittance over 50% are preferred. These materials include the transparent resins (polymers) such as polymethylmethacrylate resins, polyacrylate resins, polycarbonate resins, polyvinylalcohol resins, polyvinylpyrrolidone resins, hydroxyethylcellulose resins, carboxymethylcellulose resins, and a mixture of two or more of these resins.

For lateral spacing of the fluorescent layer, it is preferred to use the photosensitive resins to which photolithography can be applied. They include the photo-curable resist materials such as acrylic acid-based resins, methacrylic acid-based resins, polyvinyl cinnamate-based resins, and cyclic rubber-based resins.

In case the printing method is used, a printing ink (medium) using transparent resins is selected. The transparent resins include a monomer, an oligomer, or a polymer of a polyvinylchloride resin, a melamine resin, phenol resin, an alkyd resin, an epoxy resin, a polyurethane resin, a polyester resin, a maleic acid resin, and a polyamide resin, and a polymethylmethacrylate resin, a polyacrylate resin, a polycarbonate resin, polyvinylalcohol resin, a polyvinylpyrrolidone resin, a hydroxyethylcellulose resin, and a carboxymethylcellulose resin.

(5)-4 Water Content

In the fluorescence layer, the water content is favorable in a range of 0.05% or less like the organic light-emission medium, more favorable in a range of 0.03 wt. % or less, and more further favorable in a range of 0.01 wt. % or less.

This reason is that, if such water content of the fluorescence layer exceeds 0.05 wt. %, the included water accelerates the oxidation of the upper electrode and the organic light-emission medium. So that, there is the case where it is difficult to prevent the production of the non-emission parts or non-emission spots. Note that the water content of the fluorescence layer is measurable in the same manner as the organic light-emission medium.

(5)-5 Forming Method

In the case where the fluorescence layer is mainly composed of the fluorescence dyes, it is favorable to form by using a vacuum deposition method or a sputtering method through a photo-mask having a desired pattern for the fluorescence layer.

On the other hand, in the case where the fluorescence layer is mainly composed of the fluorescence dyes and resins, it is favorable to form it by mixing, dispersing or dissolving them to allow to be liquefied, forming a film using a spin-coating method, roll-coating method, or casting-method, and patterning via a desired photo-mask having a desired pattern for the fluorescence layer using a photolithography method or screen printing method.

(5)-6 Thickness

The thickness of the fluorescent layer may be in such a range that the thickness does not prevent functions to adequately absorb the luminescence of the organic EL element and to fluoresce. The range is usually 10 nm to 1 mm, preferred range is 0.5 $\mu$m to 1 mm, and more preferred range is 1 $\mu$m to 100 $\mu$m.

(6) Color Filter (6)-1 Constitution

A color filter is provided for improving the color adjustment and the contrast by decomposing and cutting light and is constructed by a pigment layer made solely from a pigment and a mixture layer made from a pigment dissolved and dispersed into a binder resin.

Also, it is favorable to use a printing process or photolithography process for forming and patterning the color filter in the same manner as a fluorescent medium.

Moreover, it is favorable for the color filter to include a blue pigment, a green pigment and a red pigment. By combining such color filter and an organic EL element emitting white light, three primary colors such as blue color, green color and red color are obtainable and full-color display is also available.

(6)-2 Pigment

As the red (R) pigment, Perylene-based pigments, lake pigments, azo-based pigments, quinacridone-based pigments, anthraquinone-based pigments, anthracene-based pigments, isoindolin-based pigments, iso-indolinone, or the like, and a mixture of two or more of these pigments can be used.

As the green (G) pigment, Polyhalogenated phthalocyanine-based pigments, polyhalogenated copper phthalocyanine-based pigments, triphenylmethane-based basic dyes, iso-indolinone-based pigments, or the like, and a mixture of two or more of these pigments can be used.

As the blue (B) pigment, Copper phthalocyanine-based pigments, indanthrone-based pigments, indophenol-based pigments, cyanine-based pigments, dioxazine-based pigments, or the like, and a mixture of two or more of these pigments can be used.

With regard to the concentration of the pigment in the color filter, its range is favorable such as to transmit the EL light sufficiently from the organic light-emission medium. Therefore, the favorable range is from 0.5 to 50 wt. % based on the weight of the color filter including binder resins, even if it is depending on the pigment kinds.

(6)-3 Binder Resin

As a binder resin of the color filter, its detailed explanation here is omitted since the similar material to the fluorescent medium can be chosen. (6)-4 Water Content In the color filter, the water content is favorable in a range of 0.05% or less like the organic light-emission medium, more favorable in a range of 0.03 wt. % or less, and more further favorable in a range of 0.01 wt. % or less.

This reason is that, if such water content of the color filter exceeds 0.05 wt. %, the included water accelerates the oxidation of the upper electrode and the organic light-emission medium. So that, there is the case where it is difficult to prevent the production of the non-emission parts or non-emission spots. Note that the water content of the color filter is measurable in the same manner as the organic light-emission medium.

(7) Planarizing Layer (7)-1 Kinds

In case the planarizing layer is made from a polymer, the favorable polymer illustrates a photo-curable resin and a thermosetting type resin. More concretely, a polyacrylate resin, a methylmethacrylate resin, a cyclic polyolefin resin, a polyacrylonitrile resin, a polyvinylidenechloride resin, a polyvinylchloride resin, a melamine resin, phenol resin, an alkyd resin, an epoxy resin, a polyurethane resin, a polyester resin, a maleic acid resin, a polyamide resin, a silicone resin, a polycarbonate resin, a polyethylene resin, a polystyrene resin, a polypropylene resin, an aniline-formaldehyde resin, fluorine contained resin are given.

In case the planarizing layer is made from inorganic materials, the favorable inorganic materials illustrates silicon oxide ($SiO_2$), aluminum oxide ($Al_2O_3$), titanium oxide ($TiO_2$), yttrium oxide ($Y_2O_3$), germanium oxide ($GeO_2$), zinc oxide (ZnO), magnesium oxide (MgO), calcium oxide (CaO), boron oxide ($B_2O_3$), strontium oxide (SrO), barium oxide (BaO), lead oxide (PbO), zirconium oxide ($ZrO_2$), sodium oxide ($Na_2O$), lithium oxide ($Li_2O$), and potassium oxide ($K_2O$), and a mixture of two or more of these oxides.

Among them, the more favorable inorganic material illustrates at least one oxide compound group consisting of silicon oxide ($SiO_2$), aluminum oxide ($Al_2O_3$), and titanium oxide ($TiO_2$) since the later described vapor permeability or oxygen gas permeability of them is small. In addition, amorphous type inorganic material (non-crystal material) is also favorable since its gas permeability is small.

Also, in case the planarizing layer is made from inorganic materials, such materials which mainly contain an inorganic oxide can be used even if nitrides such as $Si_3N_4$ are contained.

The planarizing layer made from an inorganic material includes a glass plate. Such glass plate includes the soda-lime glass, the barium and strontium-containing glass, the lead glass, the aluminosilicate glass, the boronsilicate glass, and the barium boronsilicate glass, and the like.

(7)-2 Thickness

With regard to the thickness of the planarizing layer that is depending on the resolution of the display and the roughness of the fluorescent medium and the color filter, the favorable range is from 10 nm to 1 mm. This reason is that such planarizing layer efficiently flattens the surface of the fluorescent medium and the color filter and decreases the dependency of the viewing angle of the high resolution of the display.

Therefore, the thickness of the planarizing layer is favorable in a range of 100 nm to 100 μm, and more further favorable in a range of 100 nm to 10 μm.

Also, the planarizing layer is favorably formed in a manner that it covers the fluorescent medium and the color filter, its transmittance of wavelength at 400 nm to 700 nm is 50% or more and it is an electrically insulating layer.

(7)-3 Water Content

In the planarizing layer, the water content is favorable in a range of 0.05% or less like the organic light-emission medium, more favorable in a range of 0.03 wt. % or less, and more further favorable in a range of 0.01 wt. % or less.

This reason is that, if such water content of the planarizing layer exceeds 0.05 wt. %, the included water accelerates the oxidation of the upper electrode and the organic light-emission medium. So that, there is the case where it is difficult to prevent the production of the non-emission parts or non-emission spots. Note that the water content of the planarizing layer is measurable in the same manner as the organic light-emission medium.

Also, similarly, to prevent the production of the non-emission parts or non-emission spots, the vapor permeability or oxygen gas permeability is favorable in a range of $1 \times 10^{-12}$ cc. cm/cm$^2$. s. cmHg or less, and is more favorable in a range of $1 \times 10^{-13}$ cc. cm/cm$^2$. cmHg or less.

(7)-4 Forming Method

The planarizing layer can be made by forming a film with a spin-coating method, a casting method, a screen printing method, or with the drying method such as a sputtering method, a deposition method, a Chemical Vapor Deposition (CVD) method, an ion plating method and the like.

Also, after forming the appropriate metal layer, it is anodic-oxidized to be the inorganic oxide layer. In addition, in the case where a glass plate is used as a planarizing layer, it is laminated by using an adhesive.

(8) Sealing Parts

As the sealing parts of the organic EL device, it is favorable to provide a water-proofing means to prevent the invasion of the water around the organic EL device, or to seal the sealing materials which is publicly known materials such as a drying agent, a drying gas, an inert liquid made from fluorocarbon between the forgoing water-proofing means and the organic EL device. Also, such sealing parts is available for a support substrate with a fluorescent medium and a color filter, in the case where they are provided on the upper electrode.

As for the forgoing sealing parts, the similar materials to the support substrate such as a glass plate and a metal plate are used. With regard to the shape of the forgoing sealing parts, it is not limited, but a plate-like shape and a cap-like shape are favorable. If the sealing parts is plate-like, for example, its thickness is favorably in a range of 0.01 to 5 mm.

Moreover, the sealing parts can be press-fitted to the groove provided on the organic EL device or can be fixed to the part of the organic EL device by using a photo-curable adhesive and the like.

(9) Configurations of the Organic EL Device

The organic EL element of the first embodiment has basically the above-described components and additionally combines other component elements such as hole injection layer or electron injection layer.

Figure 2:
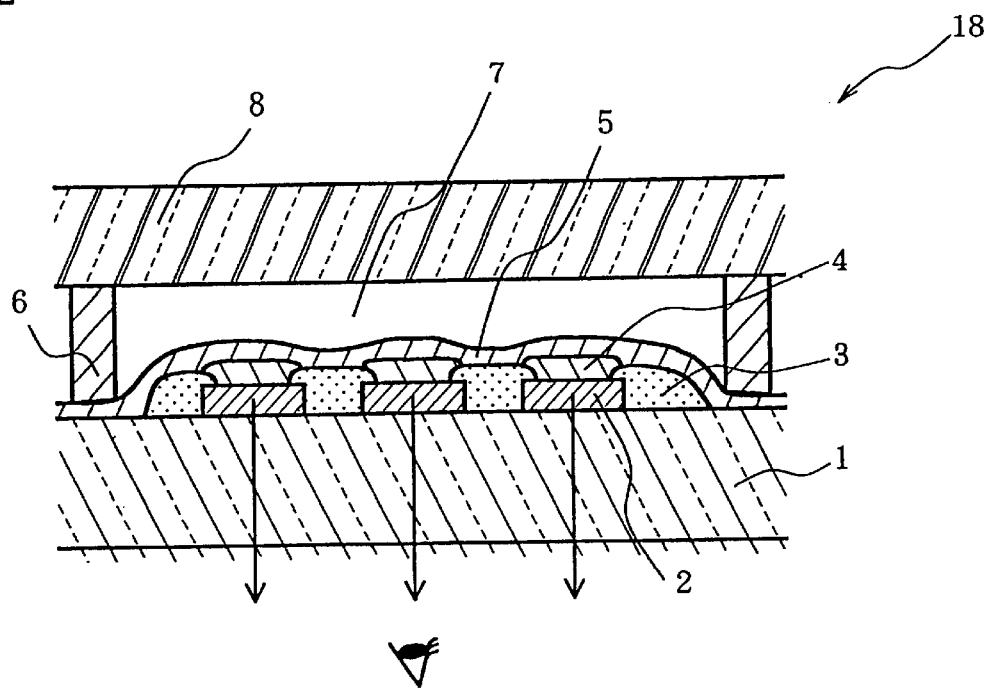
FIG. 2 is a drawing showing a sectional view of an organic EL device (No. 1).
Figure 4:
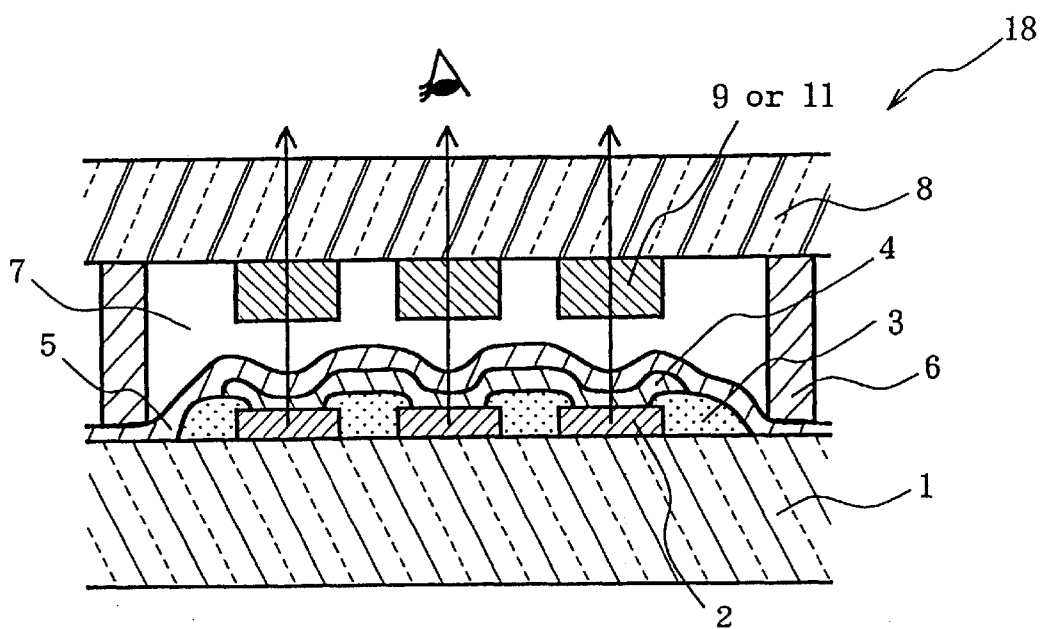
FIG. 4 is a drawing showing a sectional view of an organic EL device (No. 3).
Figure 8:
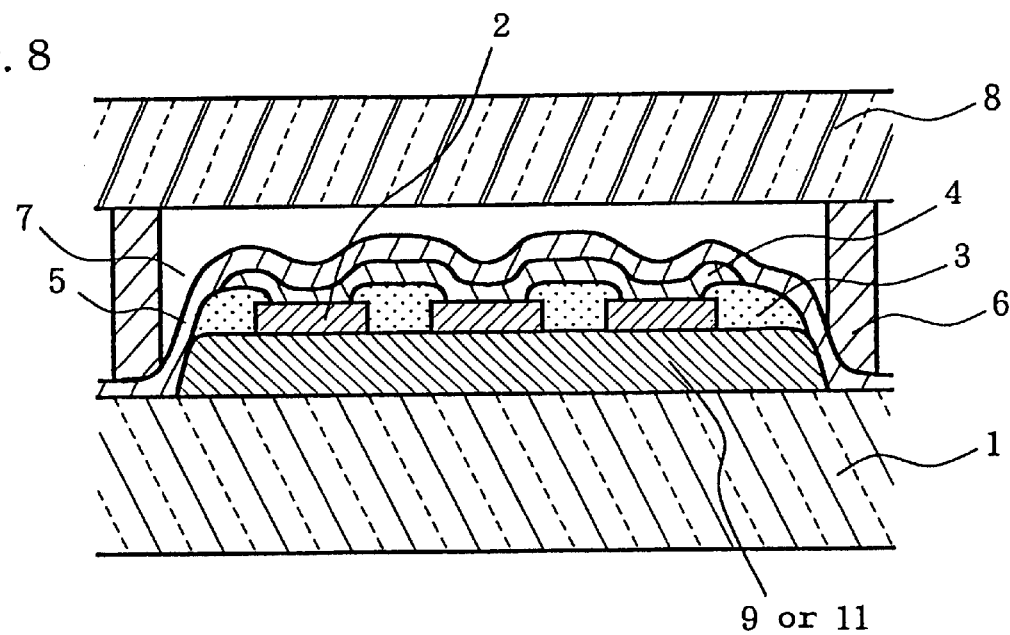
FIG. 8 is a drawing showing a sectional view of an organic EL device (No. 4).
Figure 9:
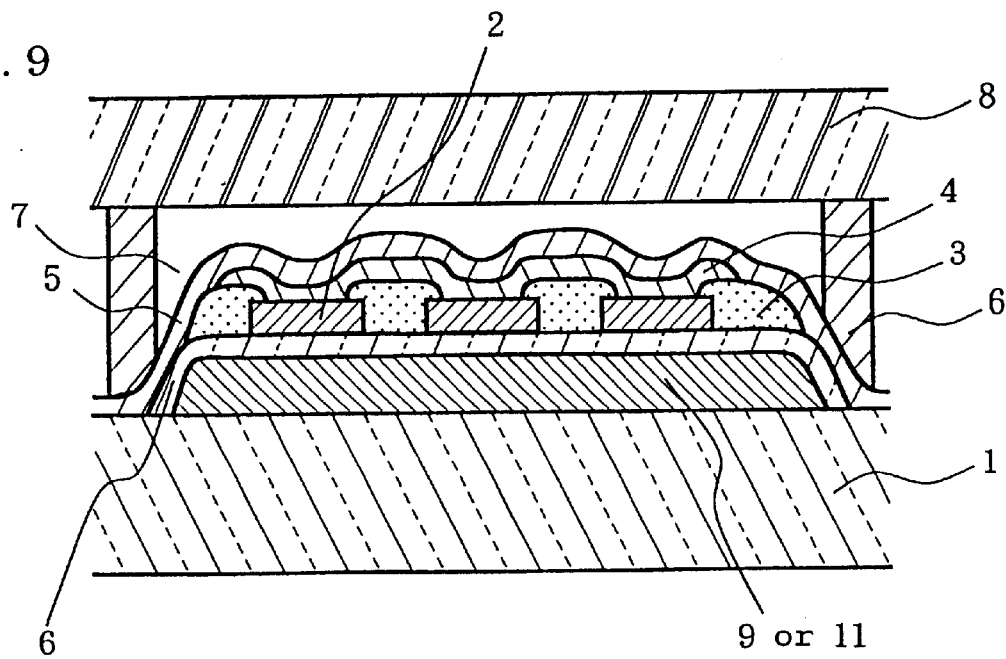
FIG. 9 is a drawing showing a sectional view of an organic EL device (No. 5).
Figure 10:
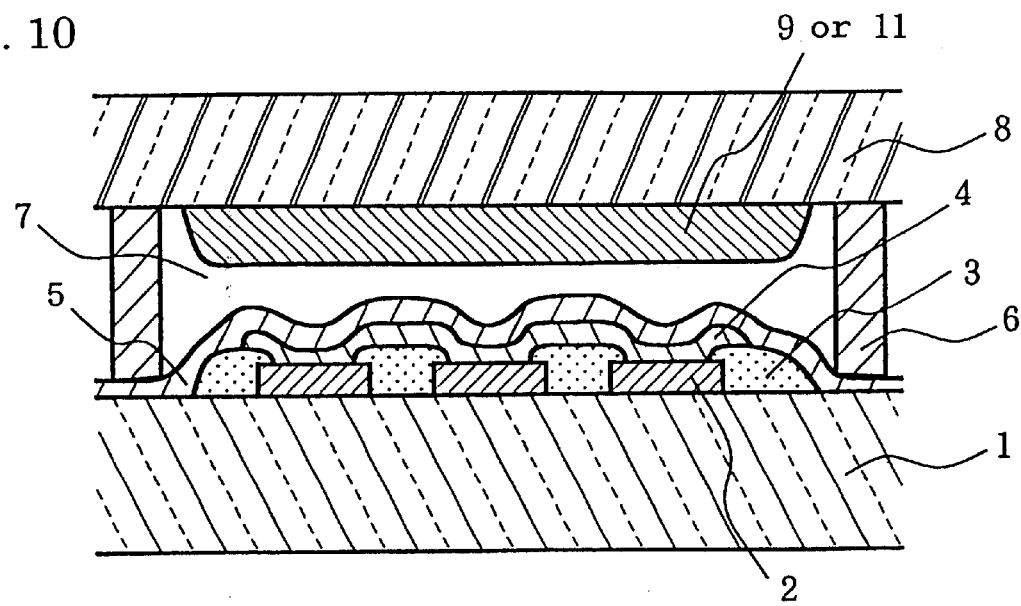
FIG. 10 is a drawing showing a sectional view of an organic EL device (No. 6).

The typical configurations of the organic EL element is indicated as follows:

(i) Substrate/anode/organic light-emission layer/cathode/sealing parts
(ii) Substrate/anode/intermediate insulating layer/organic light-emission layer/cathode/sealing parts
(iii) Substrate/fluorescent medium/anode/intermediate insulating layer/organic light-emission layer/cathode/sealing parts
(iv) Substrate/fluorescent medium/planarizing layer/anode/intermediate insulating layer/organic light-emission layer/cathode/sealing parts
(v) Substrate/color filter/anode/intermediate insulating layer/organic light-emission layer/cathode/sealing parts
(vi) Substrate/color filter/planarizing layer/anode/intermediate insulating layer/organic light-emission layer/cathode/sealing parts
(vii) Substrate/color filter/fluorescent medium/planarizing layer/anode/intermediate insulating layer/organic light-emission layer/cathode/sealing parts
(viii) Substrate/anode/organic light-emission layer/cathode/fluorescent medium/sealing parts
(ix) Substrate/anode/organic light-emission layer/cathode/color filter/sealing parts Note that FIG. 2 shows the organic EL device according to the above configuration (ii), FIGS. 3 and 9 show the organic EL device according to the above configuration (iv) or (vi), FIGS. 4 and 10 show the organic EL device according to the above configuration (viii) or (ix), and FIG. 8 shows the organic EL device according to the above configuration (iii) or (v).

[Second Embodiment]

Second embodiment relates to a manufacturing method of the organic EL device as shown in FIG. 3 (or FIG. 9) and comprises the following steps 1 to 3. It is characterized that a drying step for drying the support substrate and the like is carried out as the step 2 before forming the organic light-emission medium in the step 3, and it is characterized that the water content of the organic light-emission medium (or the mixture of an organic light-emission medium, a color filter, a fluorescent medium, a planarizing layer, and an intermediate insulating layer) should be 0.05 wt. % or less after fabricating the organic EL device according to the step 3.

By carrying out the method like this, it is possible to provide an organic EL device efficiently which comprises an organic light-emission medium having the water content of 0.05 wt. % or less without giving bad effects on the organic light-emission medium, and which can prevent the production of non-emission area or non-emission part.

Figure 11:
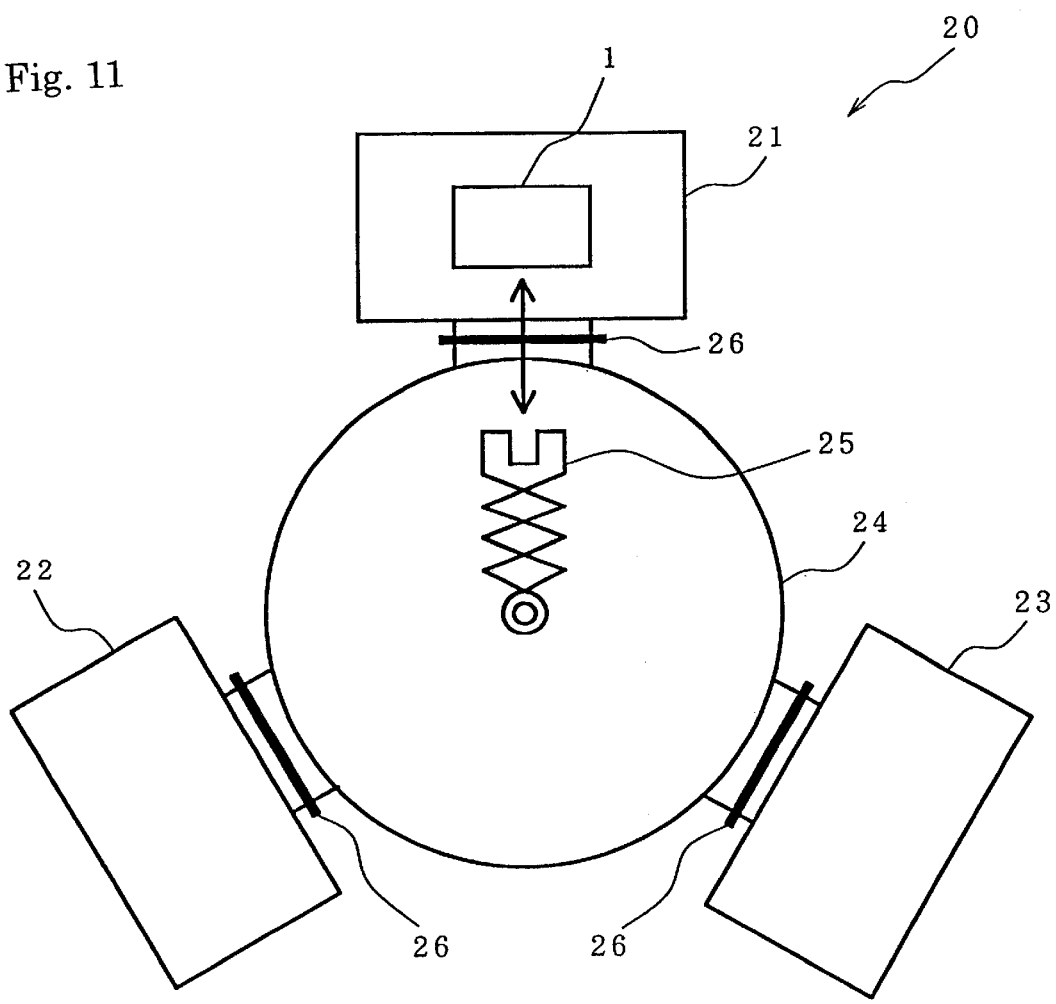
FIG. 11 is a diagram schematically showing a making apparatus for an organic EL device (No. 1).

In the second embodiment, it is characterized to make an organic EL device by using an apparatus 20 as shown in FIG. 11. Concretely, after drying a support substrate and the like by using a drying unit 21 which is connected to a deposition unit (vacuum deposition apparatus) 22, then conveying the support substrate and the like to the deposition unit 22 by using a transfer means (conveyer) 25 in the conveying unit 24, the organic light-emission medium is formed.

By carrying out the method like this, it is possible to provide an organic EL device efficiently having the low water content, since there is no time to be exposed in the atmosphere and to absorb the outside moisture.

(1) Step 1

The step 1 is carried out prior to forming an organic light-emission medium and comprises at least the formation of a lower electrode depending on the configurations of the organic EL device. Also, the step 1 comprises a formation of a first and a second intermediate insulating layers or a TFT substrate, a formation of both or each of a fluorescent medium and a color filter, and a planarizing layer.

Note that the formation of a lower electrode, a first and a second intermediate insulating layers or a TFT substrate, a fluorescent medium and a color filter, and a planarizing layer are favorably carried out by combination of the vacuum deposition method, photo-lithography method and the like.

(2) Step 2

The step 2 is a drying step for an organic layer such as a color filter, a fluorescent medium, a first and a second intermediate layer on a substrate or an intermediate layer on a TFT substrate. Concretely, it is favorable to use the following drying conditions solely or in the combination of two or more. Note that the step 2 is favorably carried out in a drying unit in the later described apparatus.

(2)-1 Dew Point Adjustment

With respect the dew point around the substrate which should be dried in a drying step, it is favorable to dry the substrate by keeping such dew point at the level of −10° C. or less. This reason is that if such dew point is over −10° C., there is the case where the drying efficiency remarkably decreases.

Therefore, the more favorable level of such dew point is of −50° C. or less, the more further favorable level of such dew point is of −50° C. to −150° C. Note that the dew point is easily controllable by controlling the water content in the drying step based on introducing an inert gas and adjusting the temperature of the drying unit while monitoring with the dew point meter.

In the case where the dew point is −10° C. or less, the favorable drying time is for example in a range of 10 minutes to 40 Hrs depending on the area or thickness of a color filter, a fluorescent medium, a first and a second intermediate insulating layers.

This reason is that if drying time is below 10 minutes, it may become difficult for the water content of the organic light-emission medium to be 0.05 wt. % or less after fabricating the organic EL device. On the other hand, if the drying time is over 40 Hrs, the drying time is too long and the obtainable effect is not increased.

Therefore, it is favorable for the drying time to be in a range of 30 minutes to 24 Hrs, and more favorable to be in a range of 60 minutes to 12 Hrs.

Dew point adjustment for drying is not effective only for the case where the organic light-emission medium is formed in a wetting process explained later in third embodiment, but also for the case where the organic light-emission medium is formed in a drying condition such as second embodiment. Thus, in the case where the organic light-emission medium is formed in a drying condition, the water content of the organic light-emission medium is not so high, and to take off the water from a support substrate and the intermediate insulating layer on the support substrate is sufficient to prevent the oxidation of the organic light-emission medium.

But dew point adjustment for drying is also effective for the case where the organic light-emission medium is not formed in a wetting process since the organic light-emission medium is not deteriorated during the drying step.

(2)-2 Evacuated Pressure Adjustment

It is favorable to keep the evacuated pressure of 13.3 Pa (0.1 Torr) or less. This reason is that if such pressure is over 13.3 Pa (0.1 Torr), there is the case where the drying efficiency remarkably decreases.

Therefore, the more favorable evacuated pressure range is of $13.3 \times 10^{-4}$ Pa ($1 \times 10^{-5}$ Torr) or less, the more further favorable evacuated pressure range is of $13.3 \times 10^{-4}$ Pa to $13.3 \times 10^{-8}$ Pa ($1 \times 10^{-5}$ Torr to $1 \times 10^{-9}$ Torr).

Also, according to this drying process, the organic light-emission medium and the fluorescent medium are not deteriorated during the drying step since the heating temperature of the support substrate and the like may be lowered and the drying time may be shortened.

For example, in the case where evacuated pressure is $13.3 \times 10^{-4}$ Pa ($1 \times 10^{-5}$ Torr) or less, the favorable drying time is in a range of 10 minutes to 30 Hrs, depending on the area and the thickness of a color filter, a fluorescent medium, a first and a second intermediate insulating layer or a volume of the drying unit and the like.

This reason is that if the drying time is below 10 minutes, it may become difficult for the water content of the organic light-emission medium to be 0.05 wt. % or less after fabricating the organic EL device. On the other hand, if the drying time is over 30 Hrs, the drying time is too long and the obtainable effect may be not changed.

Therefore, it is favorable for the drying time to be in a range of 30 minutes to 20 Hrs, and more favorable to be in a range of 60 minutes to 10 Hrs.

It is determined whether the drying step is completed or not by confirming the decrease and stable condition of the water peak value (Mw=18) with a quadruple mass spectrometer (Q-mass) which is provided in a evacuated drying vessel.

(2)-3 Introducing of Inert Gas

It is favorable to introduce inert gases such as He, Ar, and $N_2$, into a drying unit and to dry the support substrate and the like in the atmosphere of such inert gases. Also, in considering the economical aspect, $N_2$ is more favorable for drying inert gas since the production cost decreases.

By using such inert gases, it is favorable to carry out the drying step without oxidizing the organic layer including a light-emission medium and a cathode.

In addition, it is favorable to dry the inert gases in advance to obtain the more excellent drying effect.

For example, in the case where inert gas is introduced for drying, the favorable drying time is in a range of 10 minutes to 40 Hrs, depending on the fluid of the inert gas, the area and the thickness of a color filter, a fluorescent medium, a first and a second intermediate insulating layer or a volume of the drying unit and the like.

This reason is that if drying time is below 10 minutes, the drying process may be insufficient and it may be difficult for the water content of the organic light-emission medium to be 0.05 wt. % or less after fabricating the organic EL device. On the other hand, if drying time is over 40 Hrs, the drying time is too long and the obtainable effect may be not changed.

Therefore, it is favorable for the drying time to be in a range of 30 minutes to 24 Hrs, and more favorable to be in a range of 60 minutes to 12 Hrs.

(2)-4 Heating Process

It is favorable to keep the drying temperature in the drying step within the range of 60 to 300° C. This reason is that if the drying temperature is below 60° C., the drying process may be insufficient. On the other hand, if the drying temperature is over 300° C., the organic layers such as a light-emission medium and a fluorescent layer, if any, may be deteriorated.

Therefore, it is favorable for the drying temperature in the drying step within a range of 100 to 250° C.

Also, it is favorable to determine the heating temperature of the drying step in considering the storage condition or the operating condition of an organic EL device. Thus, it is favorable to determine the heating temperature of the drying step which is higher than the storage temperature or the operating temperature and more favorable to pre-heat it in advance at least 10° C. or more of these temperatures in order to prevent the production of the non-emission parts or non-emission spots in the storage condition or the operating condition.

For example, in the case where heating process is carried out for drying, the favorable drying time is in a range of 10 minutes to 12 Hrs, depending on the area and the thickness of a color filter, a fluorescent medium, a first and a second intermediate insulating layer or a volume of the drying unit and the like.

This reason is that if drying time is below 10 minutes, the drying process may be insufficient and it may be difficult for the water content of the organic light-emission medium to be 0.05 wt. % or less after fabricating the organic EL device. On the other hand, if drying time is over 12 Hrs, the drying time is too long and the obtainable effect may be not changed.

Therefore, it is favorable for the drying time to be in a range of 30 minutes to 10 Hrs, and more favorable to be in a range of 60 minutes to 6 Hrs.

(2)-5 Combination of Drying Process

It is favorable to combine the above-described two or more drying conditions to shorten the total drying time.

For example, when the organic light-emission medium is formed in the drying conditions, it is possible to take out the water sufficiently from the support substrate by keeping the dew point level of −50° C., introducing the dried $N_2$, and heating the supporting substrate and the like at 60° C. for 30 minutes to 3 Hrs prior to forming the organic light-emission medium and to easily adjust the water content of the organic light-emission medium at the level of 0.05 wt. % or less after fabricating the organic EL device.

It is not the combination of the drying process, but it is favorable to dry the organic EL element and a sealing parts in the step 2 when the organic EL device was fabricated by combining a sealing parts which is provided with a color filter and a fluorescent medium on a sealing substrate and an organic EL element which is provided with a lower electrode, an organic light-emission medium, and the opposite electrode on the support substrate.

By carrying out the drying process like this, it becomes easy for the water content of the organic light-emission medium to be 0.05 wt. % or less after fabricating the organic EL device and it is possible to prevent the production of the non-emission parts or non-emission spots, even if a color filter is formed on the supporting substrate.

It is also favorable to maintain the supporting substrate in the condition without exposing the atmosphere until it is transferred to step 3 after carrying out the drying process.

Moreover, even if the support substrate has to be exposed to the atmosphere condition after carrying out the drying process, the exposing time favorably should be 10 minutes or less, more favorably should be 5 minutes or less.

This reason is that if the exposing time is over 10 minutes, there is the possibility that the support substrate and the like absorb the water from the atmosphere again.

(3) Step 3

The step 3 is a step for forming an organic light-emission medium, an upper electrode, a sealing process and the like.

In the formation of an organic light-emission medium and an upper electrode, it is favorable to form them in the later described deposition unit, concretely in the drying conditions such as a deposition method, a sputtering method and the like.

Also, it is favorable to carry out the sealing process in the later described sealing unit by introducing a drying agent and drying gas and by laminating a sealing parts.

(4) Apparatus

An apparatus for an organic EL device favorably has a drying apparatus (drying unit) for maintaining the water content below the predetermined level to manufacture an organic EL device having the good reliability, easily and efficiently.

Concretely, as shown in FIG. 11, an apparatus favorably has a deposition unit 22, a drying unit 21, a sealing unit 23, a conveying unit 24, wherein a drying unit 21 is connected to both of a deposition unit 22 and a sealing unit 23 via a conveying unit 24 comprising a gate valve 26 and a conveyer 25.

Figure 13:
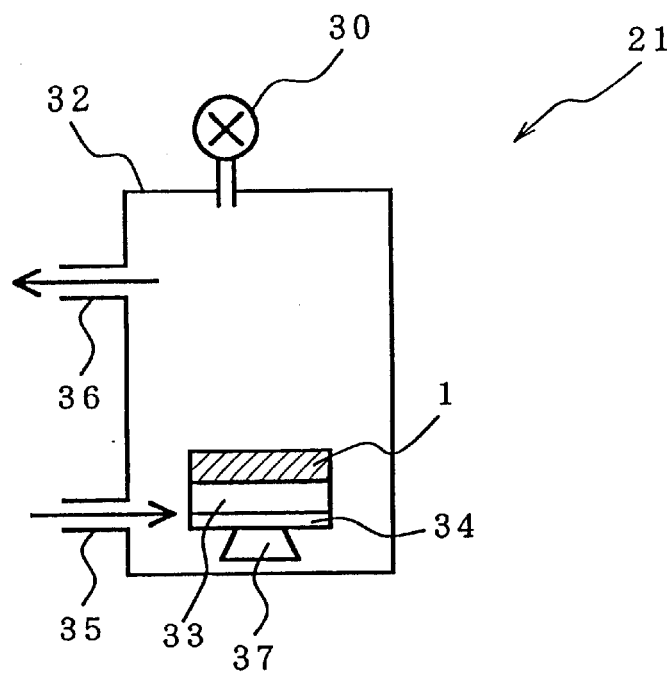
FIG. 13 is a diagram schematically showing a drying unit for a making apparatus of an organic EL device (No.

Here, the drying unit will be explained in detail. As shown in FIG. 13, the drying unit 21 is a drying box and is constructed by a housing 32, a stage 33 for placing a support substrate 1 and the like, a hot plate 34 (including a cooling device), a drying gas circulation device 35, 36, a dew point meter 30, and optionally an automatic water adsorption and desorption apparatus as shown in FIG. 18.

On the side of the drying unit 21, the conveying unit 24 comprising a gate valve and a conveyer is favorably provided and a deposition unit (not illustrating) and a sealing unit (not illustrating) are connected via conveying unit 24.

Figure 14:
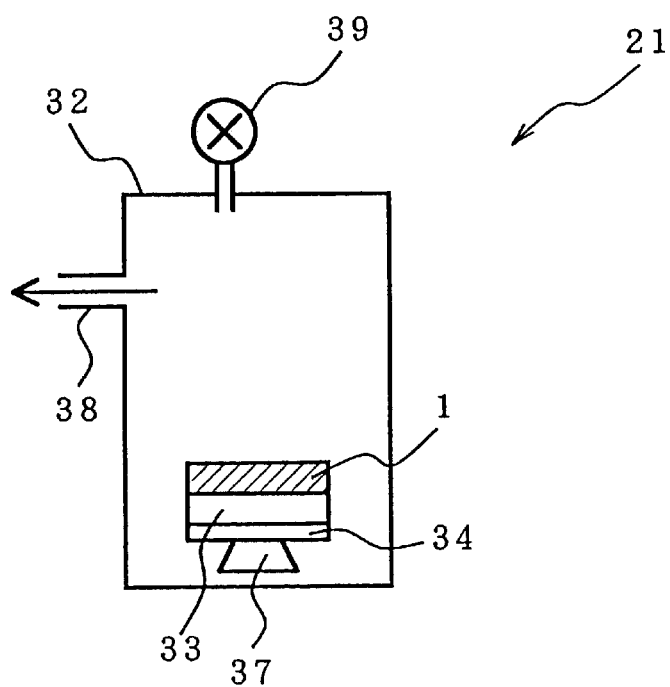
FIG. 14 is a diagram schematically showing a drying unit for a making apparatus of an organic EL device (No. 2).
Figure 15:
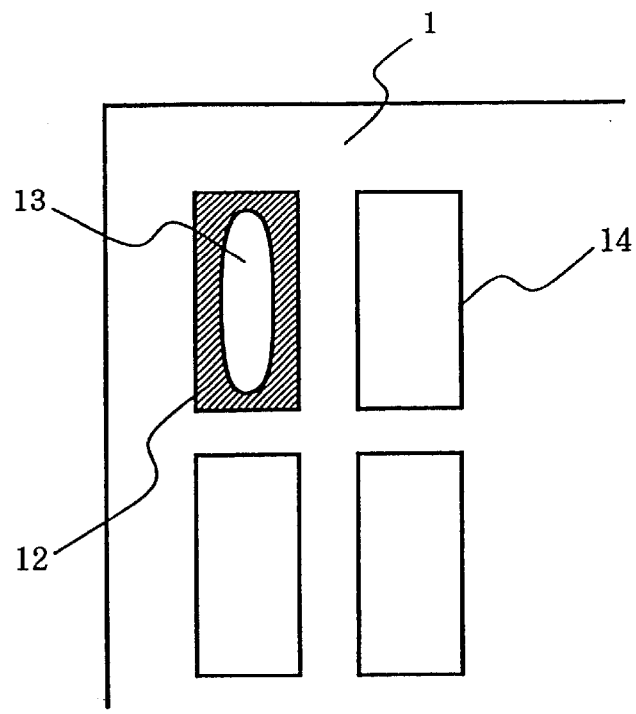
FIG. 15 is a diagram for explaining a non-emission area or a non-emission spot (No. 1).
Figure 16:
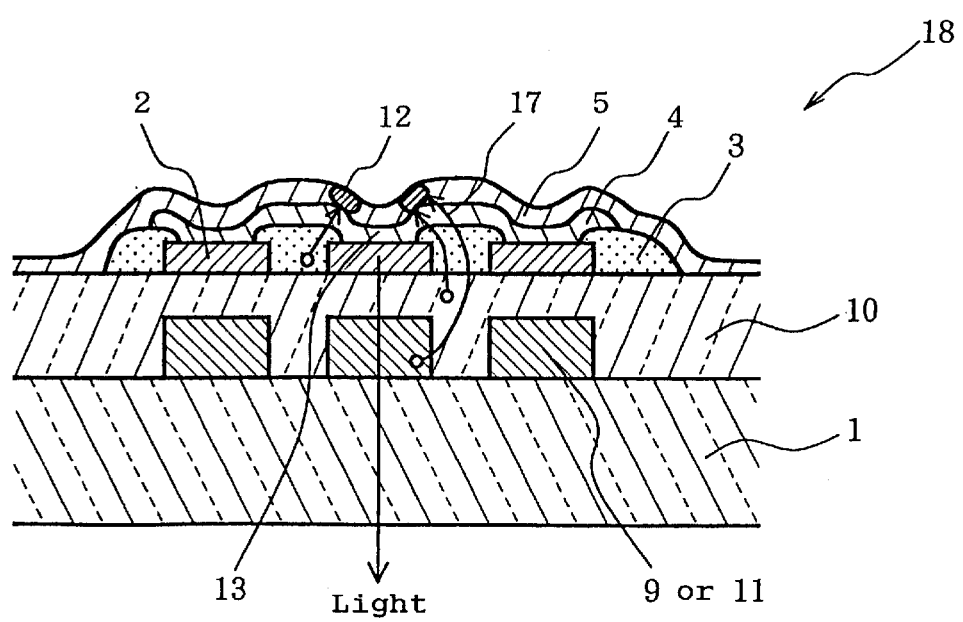
FIG. 16 is a diagram for explaining a non-emission area or a non-emission spot (No. 2).
Figure 17:
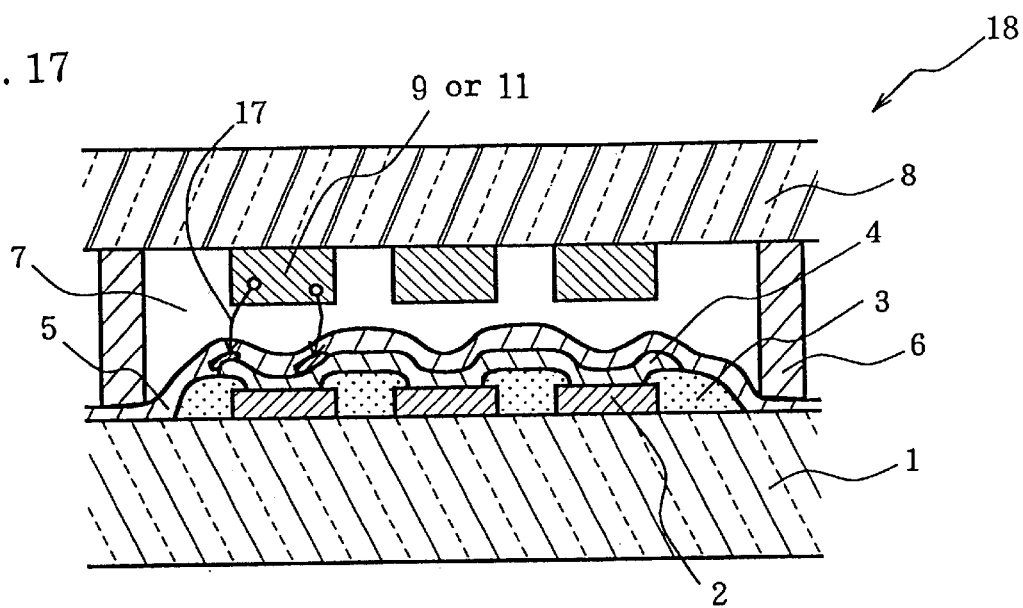
FIG. 17 is a diagram for explaining a non-emission area or a non-emission spot (No. 3).

The other embodiment of the drying unit 21 is shown in FIG. 14 and it is a drying box provided with a housing 32, a stage 33, a hot plate 34 (including a cooling device), a vacuum pump 38, a pressure gauge 39, and optionally an automatic water adsorption and desorption apparatus as shown in FIG. 18.

Also, like a drying unit 21 as shown in FIG. 13, the conveying unit 24 comprising a gate valve and a conveyer is favorably provided on the side of the drying unit, and a deposition unit (not illustrating) and a sealing unit (not illustrating) are connected via conveying unit 24.

Moreover, it is favorable to combine a drying unit as shown in FIG. 13 and a drying unit as shown in FIG. 14 since it is possible to efficiently and functionally carry out the vacuum process and the introducing of the drying gas.

Among these components, a housing 32 is a member for providing a support substrate 1 for drying and stage 33 that is fixing the support substrate 1 for drying.

Also, a hot plate 34 and a cooling device are provided under the stage 33 or the stage is made as a hot plate. These hot plate 34 and cooling device is a drying device for adjusting a temperature of the support substrate 1 and the like on the stage. To shorten the heating time, it is favorable to provide other heating device such as an infrared ray lamp in place of a hot plate or with a hot plate.

Also, a drying gas circulating device 35,36 is provided for drying the water by introducing an inert gas while adjusting the dew point with a dew point meter 30. In the example as shown in FIG. 13, an inlet 35 of an inert gas is provided on the lower side and an exit 36 of an inert gas is provided on the upper side.

Therefore, if the drying unit 21 is used as shown in FIG. 13, it is favorable to dry a support substrate fixed to a stage in a housing by blowing as inert gas with a drying gas circulating device at the rate of 10 litters/minutes for the predetermined time while confirming dew point at the level of −10° C. or less with a dew point meter.

It is also favorable to carry out the drying process while keeping the predetermined temperature such as 60 to 300° C. by using a hot plate or cooling device provided under the stage at the same time or the different time of introducing an inert gas.

On the other hand, if the drying unit 21 is used as shown in FIG. 14, it is favorable to carry out the drying process for the predetermined time by adjusting the evacuated pressure at 13.3 Pa (0.1 Torr) or less in a housing with a vacuum pump 38, and more favorable at 0.00133 Pa ($1\times10^{-5}$ Torr) or less.

In the case of the evacuated condition, it is favorable to confirm the drying level in advance by using a quadruple mass spectrometer (Q-mass).

Also, when the water content of an organic light-emission medium is measured in a drying unit 21 as shown in FIGS.

13 and 14, an automatic water adsorption and desorption measuring device (not illustrating) that is provided a drying unit 21 is used. Thus, a part of organic light-emission mediums are sampled from a support substrate and the like and its weights A and B are measured to calculate the water content of the organic light-emission medium. Note that sampling of the organic light-emission medium can be available by using a manual procedure or an automatic procedure with a picking device.

However, it is possible roughly to measure the water content of the organic light-emission medium or the organic layers including the organic light-emission medium without sampling the organic light-emission medium and the like depending on the configuration of the organic EL device.

Thus, it is possible to estimate the water content (W) of the organic light-emission medium or an organic layer comprising the organic light-emission medium from the following equation (2) based on weight C, weight D and weight E. This weight C is namely a weight before drying of an organic light-emission medium including a support substrate or the organic layers including a support substrate that is measured by using a precise balance of an automatic water adsorption and desorption measuring device. The weight D is a weight after drying. The weight E is a weight of the support substrate except the organic light-emission medium or a weight of the organic layers that are measured in advance by using a precise balance.

$$W=[(Weight\ C-Weight\ D)/(Weight\ D-Weight\ E)]\times 100 \quad (2)$$

On the other hand, a deposition unit and a sealing unit are respectively connected to a conveying unit that is also connected to a drying unit. Since some conveyer such as a robot arm, which is pivoted, has a grip on the tip part and is expansible, are provided among them, the support substrate and the like can be conveyed without exposing the atmosphere from the drying unit to the deposition unit or the sealing unit, or from the deposition unit to the drying unit or the sealing unit respectively.

Therefore, by using an apparatus for an organic EL device, it is possible to dry a support substrate and the like in a drying unit prior to forming an organic light-emission medium and then to form an organic light-emission medium having a low water content in the deposition.

After forming an organic light-emission medium, a support substrate and the like are transported from a deposition unit to a sealing unit and its surroundings are sealed with sealing parts to fabricate an organic EL device having the water content of the organic light-emission medium below the predetermined level.

Therefore, it is possible to provide an organic EL device efficiently that can prevent the decrease of the emitting area based on the production of the non-emission parts or non-emission spots and can maintain the high brightness for a long time.

Figure 12:
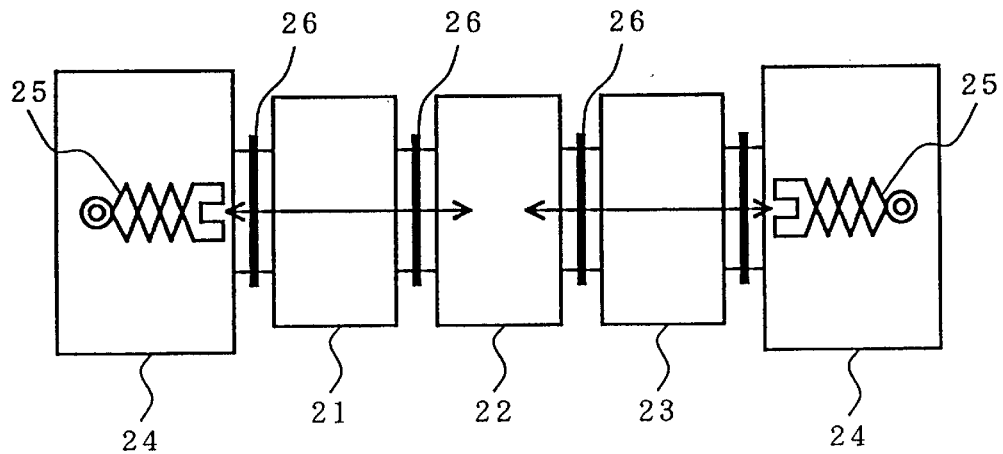
FIG. 12 is a diagram schematically showing a making apparatus for an organic EL device (No. 2).

Note that the present organic EL device can be produced by carrying out steps 1 to 3 with an apparatus as shown in FIG. 12 as well as an apparatus shown in FIG. 11.

Thus, according to the apparatus as shown in FIG. 12, for example, a drying unit 21, a deposition unit 22 and a sealing unit 23 are arranged in lateral series via gate valves 26 and the conveying unit 24 is provided respectively at the initial part and the terminal part of the series.

Therefore, according to the apparatus as shown in FIG. 12, it is possible for the support substrate and the like to convey among a drying unit 21, a deposition unit 22 and a sealing unit 23 without exposing atmosphere and to fabricate an organic EL device comprising an organic light-emission medium having the water content below the predetermined value.

[Third Embodiment]

Third embodiment is other embodiment of the producing method of the present organic EL device and it comprises the following steps 1' to 3'. It is characterized that the an organic light-emission medium is formed by using a wetting process in step 1', it is dried in a drying step after forming it and an organic EL device comprising the organic light-emission medium (or mixture of the organic light-emission medium, a color filter, a fluorescent medium, a planarizing layer and a intermediate insulating layer) having the water content at the level of 0.05 wt. % or less is finally fabricated in step 3'.

By carrying out the drying process like this, it is possible to maintain the water content of the organic light-emission medium at the level of 0.05 wt. % or less after fabricating an organic EL device, even if the organic light-emission medium is formed by using a wetting process that is the condition that the water content tends to be increased.

(1) Step 1'

Step 1' includes a forming step for an organic light-emission medium as well as a fluorescent layer, a color filter, a planarizing layer, a lower electrode, a first and second intermediate insulating layers and TFT substrate (including an intermediate insulating layer).

Here, it is favorable to form a lower electrode, a first and second intermediate insulating layers, TFT substrate (including an intermediate insulating layer), a fluorescent layer, a color filter and a planarizing layer respectively by using a lithography like a second embodiment.

In the third embodiment, it is characteristic to form an organic light-emission medium by using a wetting process such as a spin coating, a Langmuir-Blodgett technique (LB technique), an ink-jet printing method, and micelle disruption method.

(2) Step 2'

Step 2' is a drying step for the organic light-emission medium formed by a wetting process and its drying condition is essentially same as that of the second embodiment. Therefore, it is possible to dry an organic light-emission medium effectively by (i) a dew point adjustment, (ii) evacuated pressure adjustment, (iii) introducing an inert gas and (iv) a heating process respectively or in the combination of these two or more drying conditions.

The above-described (i) a dew point adjustment is especially suitable for drying of the organic light-emission medium formed by using a wetting process. This is because the organic light-emission medium formed by using a wetting process includes much water content and there is the case where it becomes difficult to dry the water without deteriorating the organic light-emission medium by using other drying methods such as heating process.

However, it is possible to prevent the oxidation of the organic light-emission medium efficiently by taking out the water from the support substrate and the intermediate insulating layer, even if the organic light-emission medium formed by the drying process such as a vacuum deposition in place of a wetting process method does not include much water.

Thus, it is possible to keep the water content of the organic light-emission medium below the predetermined level after fabricating of the organic EL device only by drying the support substrate and the like in the condition which dew point is controlled under the level of −10° C. or less.

Therefore, the dew point adjustment is suitable for drying of the organic light-emission medium formed by using a wetting process as well as that formed by the other drying methods since it is possible to dry them without deteriorating.

In addition, it is without saying that it is favorable for the formed organic light-emission medium and the like to transfer them from step 2' to step 3' without exposing the atmosphere, since it becomes easier to control the water content of the organic light-emission medium and the like.

(3) Step 3'

Step 3' is a process after forming an organic light-emission medium. It is favorable to form an upper electrode and to carry out the sealing in the Step 3' like the second embodiment.

Concretely, an upper electrode is favorably to be formed by using a vacuum deposition method. Also, it is favorable to seal the surroundings of the organic light-emission medium with sealing parts in a sealing unit.

EXAMPLE

Example 1

(1) Fabrication of an Organic EL Element (i) Formation of an Anode (Lower Electrode)

An ITO layer having a thickness of 130 nm was formed on a transparent glass substrate (OA2 glass, manufactured by Nippon Electric Glass Co., Ltd.) having a dimension of 1.1 mm (thickness)×112 mm (length)×143 mm (width) by using a sputtering method. A positive type photo-resist HPR204 (manufactured by FUJI FILM OLIN Co., Ltd.) was spin-coated on the ITO layer, and baked at 80° C. for 15 minutes.

Then, through a photo-mask having striped patterns (line width: 90 $\mu$m; line gap: 20 $\mu$m), a contact exposure was carried out at a dose of 100 mJ/cm$^2$ by using an exposing machine having a light source of a high-pressure mercury lamp. The photo-resist was developed with an aqueous solution of tetramethylammoniumhydroxide (TMAH).

Then, after carrying out the post-baking at 130° C. in an oven, the exposed ITO layer was etched by using an etching solution (etchant) of an aqueous solution of hydrogen bromide (conc. 47 wt. %).

After that, the positive type photo-resist was removed by using a removing solution N303 (manufactured by NAGASE & Co., Ltd.) to form stripe-shaped ITO patterns (line numbers: 960) as an anode (lower electrode).

(ii) Formation of a First Intermediate Insulating Layer

Next, on the ITO patterns, an acrylate-based negative type photo-resist V259PA (manufactured by Nippon Steel Chemical Co., Ltd.) was spin-coated and baked at 80° C. for 15 minutes. Through a photo-mask having patterns which can make a rectangular part for exposing an ITO pattern having the size of 70 $\mu$m×290 $\mu$m, a contact exposure was carried out at a doze of 300 mJ/cm$^2$ by using an exposing machine having a light source of a high-pressure mercury lamp.

Then, the photo-resist was developed with a solution of TMAH as a developer and subsequently the post-baking was carried out at 160° C. to form a first intermediate insulating layer.

(iii) Formation of a Second Intermediate Insulating Layer

Next, on the first intermediate insulating layer, a novolac—based negative type photo-resist ZPN1100 (manufactured by Nippon Zeon Co., Ltd.) was spin-coated and baked at 80° C. for 15 minutes. Through a photo-mask having patterns which can make the cross-direction patterns (line width: 20 $\mu$m; line gap: 310 $\mu$m) toward the lower ITO patterns, a contact exposure was carried out at a dose of 70 mJ/cm$^2$ by using an exposing machine having a light source of a high-pressure mercury lamp. Post-baking was carried out at 90° C. for 15 minutes.

Then, the photo-resist was developed with a solution of TMAH as a developer to form a second intermediate insulating layer (line width: 20 $\mu$m; line gap: 310 $\mu$m, thickness: 5 $\mu$m) as a separating wall.

(iv) Drying Step

Next, the glass substrate having ITO patterns and intermediate insulating layers (hereinafter just called as the glass substrate) was washed with isopropyl alcohol and ultraviolet ray and was conveyed to a drying unit to carry out the drying step.

The above glass substrate was placed in a drying box provided with an inert gas circulation unit such as He, Ar, N$_2$ and the like, a dew point regulation unit and a heating unit (hot plate).

The glass substrate in the drying box was heated at 60° C. by using a hot plate. By introducing dried N$_2$ in the drying box while heating to keep the dew point at −50° C. for about 2 hours, the water contained in the first and the second intermediate insulating layers and the glass surface were taken off.

(v) Formation of Organic Light-emission Medium

After the heating with a hot plate was stopped and the temperature of the glass substrate was reached to the room temperature, the glass substrate was fixed to a holder in a vacuum deposition apparatus (manufactured by ULVAC Co., Ltd.) without exposing to the atmosphere condition and with maintaining the dew point at the same level.

The following materials were placed on molybdenum heating boats in the vacuum deposition apparatus.

Hole injection materials: 4,4',4"-tris[N-(3-metylphenyl)-N-phenylamino]-triphenylamine(MTDATA) and 4,4'-bis[N-(1-naphthyl)-N-phenylamino]-biphenyl(NPD)

Organic light emission material: 4,4'-bis(2,2-diphenylvinyl)-biphenyl (DPVBi)

Electron injection material: Tris(8-quinolinol)aluminum (Alq)

As an opposite electrode (cathode) material, Al-Li alloy (Li content: 10 atm. %) was placed on a tungsten filament.

Then, the evacuated pressure in the vacuum deposition apparatus was decreased to 665×10$^{-7}$ pa (5×10$^{-7}$ Torr) and an organic light-emission medium was formed successively, namely without breaking from formation of a hole injection layer to a cathode in the following deposition rates and thickness.

MTDATA: deposition rate 0.1 to 0.3 nm/sec. thickness 60 nm

NPD: deposition rate 0.1 to 0.3 nm/sec. thickness 20 nm

DPVBi: deposition rate 0.1 to 0.3 nm/sec. thickness 50 nm

Alq: deposition rate 0.1 to 0.3 nm/sec. thickness 20 nm

Al-Li: deposition rate 0.5 to 1.0 nm/sec. thickness 150 nm (vi) Sealing Step

Next, in a sealing unit introduced with a dried N$_2$ gas, a sealing glass (soda lime glass, manufactured by GEOMATEC COMPANY, LIMITED) was laminated onto a cathode layer and its surroundings were sealed with a photo-curing type adhesive TB3102 (manufactured by Threebond Co., Ltd.) to fabricate an organic EL device as shown in FIG. 2 for measuring the light-emission properties.

Also, same type organic EL devices for measuring the water content and for carrying out the durability test were respectively fabricated in the same manners.

(2) Evaluation of Organic EL Device (i) Water Content

Thus obtained organic EL device was decomposed in a drying box introduced continuously with dried N$_2$. Some organic light-emission mediums (partially included intermediate insulating layers) were sampled by using a spatula and its weight was measured by using an automatic water adsorption and desorption measuring apparatus IGA SORP (manufactured by Hiden Co., Ltd. in GB) which was provided in the drying box. As a result, its light-emission medium weight (weight A) was 43.9194 mg.

Then, the sampled light-emission medium was heated at 80° C. for 30 minutes in the drying box and after heating its weight was measured by using the above-described automatic water adsorption and desorption measuring apparatus IGA SORP. As a result, its light-emission medium weight (weight B) was 43.9190 mg.

Therefore, based on the obtained weights such as weight A and weight B, the water content of the light-emission medium was calculated from the above-described equation (1). As a result, its water content of the light-emission medium was 0.0009 wt. %.

From this results, it was confirmed that to take off the water from the substrate surface and the first and the second intermediate insulating layers with a drying step prior to forming the light-emission medium was very effective to reduce the water content of the light-emission medium.

(ii) Light-emission Property evaluation

DC voltage of 10V was applied between the lower electrode (ITO pattern, or anode) and the opposite electrode (cathode) of the obtained organic EL device and each pixel (pixel number: about $23 \times 10^4$) which was crossing point of the above electrodes was emitted.

The luminescence brightness of the organic EL element which was measured by using chroma meter CS 100 (manufactured by Minoluta Co., Ltd.), was 300 cd/m$^2$.

Note that the ratio of the light-emission pixel area to the total light-emission area (100%) was 56%.

Also, the chromaticity was measured in the same emitting conditions and blue color light having chromaticity of CIE x=0.15 and CIE y=0.18 in CIE chromaticity coordinates (JIS Z 8701), was observed.

(iii) Durability Test

Two sets of the obtained organic EL device were prepared. One was placed respectively in the room condition (atmosphere, 25° C.) and the other was placed in the constant temperature oven at 80° C. for 2 weeks.

After that, the light-emission area of the each pixel except non-emission area and non-emission spot (hereinafter emission area) was measured by applying the above-mentioned voltage to the obtained organic EL device and its durability was evaluated from the comparison with the initial light-emission area.

Also, the luminescence brightness of the two sets of organic EL element after 2 weeks were respectively measured.

As a result, when the initial light-emission area is 1, the light-emission area after 2 weeks in the room condition was 0.98 and the light-emission area after 2 weeks in the constant temperature oven of 80° C. was 0.97. Also, the luminescence brightness of the two sets of organic EL element were respectively 294 cd/m$^2$ after 2 weeks at the room condition and 291 cd/m$^2$ after 2 weeks at the 80° C. oven.

From these results, it was confirmed that to keep the water content of the organic light-emission medium below the predetermined value (0.05 wt. % or less) could prevent the shrinkage of the light-emission area and the decrease of the luminescence brightness at the high temperature condition (80° C.) as well as the room condition (atmosphere, 25° C.).

Example 21

(1) Fabrication of an Organic EL element
(i) Formation of an Anode (Lower Electrode)

A fluorescent medium composition (a fluorescent medium ink) was prepared by mixing; 100 g of an acrylate-based photo-resist V259PA (manufactured by Nippon Steel Chemical Co., Ltd., solid content: 50 wt. %, solvent: propylene glycol methyl ether acetate) as a photo-curing type resin, 0.53 g of Coumarin 6, 1.5 g of basic violet 11, and 1.5 g of Rhodamine 6G as an organic fluorescent dyes and 25 g of a benzoguanamine resin as a pigment resin with a ball mill.

The obtained fluorescent medium composition was spin-coated onto a glass substrate (OA2 glass, manufactured by Nippon Electric Glass Co., Ltd.) having a dimension of 1.1 mm (thickness)×112 mm (length)×143 mm (width) and was dried at 80° C. for 10 minutes.

Then, through a photo-mask corresponding to the display pattern, ultra violet ray (wave length: 365 nm) was irradiated at a dose of 1500 mJ/cm$^2$ and the fluorescent medium composition was photo-cured to form a fluorescent part (color changing part). Non-exposure part of the fluorescent medium composition was developed with a developer (2 wt. % of KOH solution).

Then, the post-baking was carried out at 160° C. for 30 minutes to produce a fluorescent medium having thickness of 20 $\mu$m.

(ii) Fabrication of an Organic EL Device

An Indium Zinc oxide layer (IZO) with a thickness of 200 nm was deposited by using a sputtering method onto the glass substrate having a fluorescent medium which was formed in the above-described (i).

An IZO layer was patterned in the same conditions as example 1 to form an anode (lower electrode) and a first and a second intermediate insulating layers were formed on them respectively.

After that, a drying step was carried out in the same condition as example 1 and then a hole injection layer, a light-emission layer, an electron injection layer and a cathode were formed respectively.

Further, a sealing glass (soda lime glass, manufactured by GEOMATEC COMPANY, LIMITED) was laminated onto a cathode layer and its surroundings were sealed with a photo-curing type adhesive TB3102 (manufactured by Threebond Co., Ltd.) to fabricate an organic EL device as shown in FIG. 8.

(2) Evaluation of the Organic EL Device
(i) Water Content

Some organic light-emission mediums (partially included the first and the second intermediate insulating layers and a fluorescent medium and IZO layer) were sampled and the weight was measured by using an automatic water adsorption and desorption measuring apparatus IGA SORP.

As a result, the weight of the sampled organic luminescence medium (weight A) was 201.3977 g and the dried weight of organic luminescence medium (weight B) was 201.3360 g.

Therefore, the water content was 0.0306 wt. %. Thus, it was confirmed that to take off the water from the fluorescent medium and the first and the second intermediate insulating layers in a drying step prior to forming the organic light-emission medium was very effective to reduce the water content of the organic light-emission medium.

Note that the content of the water in the fluorescent medium and the first and the second intermediate insulating layers were measured in the same conditions as described above and they were below 0.05 wt. % respectively. Also, the content of the water in the IZO pattern was measured in the same conditions as described above and it was confirmed that it was below 0.001 wt. %.

(ii) Light-emission Property Evaluation

The luminescence brightness of the organic EL element was measured in the same condition as example 1 such as, by applying DC voltage of 10V between the lower electrode (IZO pattern, or anode) and the opposite electrode (cathode) of the obtained organic EL device and its value measured by chroma meter CS100 was 90 cd/m².

Also, the chromaticity was measured in the same emitting conditions as example 1 and the red color light having chromaticity of CIEx=0.61 and CIEy=0.34 in CIE chromaticity coordinates, was observed.

Note that the ratio of the light-emission pixel area to the total light-emission pixel area (100%) was 56%.

(iii) Durability Test

Two sets of the obtained organic EL device were prepared. One was placed respectively in the room condition (atmosphere, 25° C.) and the other was placed in the constant temperature oven at 80° C. for 2 weeks like example 1. The durability was evaluated from the change of the light-emission area.

As a result, the light-emission area after 2 weeks in the room condition was 0.93 and the light-emission area after 2 weeks in the constant temperature oven at 80° C. was 0.90.

From these results, it was confirmed that to keep the water content of the organic light-emission medium below the predetermined value (0.05 wt. % or less) could prevent the shrinkage of the light-emission area due to the occurrence of the non-emission parts or the non-emission spots at the high temperature condition (80° C.) as well as the room condition (atmosphere, 25° C.) for a long time.

Example 3

(1) Fabrication of an Organic EL Device

The organic EL device as shown in FIG. 9 was fabricated in the same manners as example 2 except that a planarizing layer (flat layer) was formed between the fluorescent medium and the anode (lower electrode).

After forming of the fluorescent medium, V259PA (manufactured by Nippon Steel Chemical Co., Ltd.) was spin-coated as an acrylate-based material for a planarizing layer and it was dried at 80° C. for 15 minutes. Through a photo-mask having patterns which can cover the fluorescent medium, a contact exposure was carried out at a dose of 300 mJ/cm² by using an exposing machine having a light source of a high-pressure mercury lamp.

Then, the unexposed material for the planarizing layer was developed with a solution of TMAH and the post-baking at 160° C. was further carried out to form the planarizing layer having a thickness of about 5 μm.

(2) Evaluation of the Organic EL Device (i) Water Content

In the same manner as example 1, some organic light-emission mediums (partially included the fluorescent medium, the planarizing layer, IZO layer and the first and the second intermediate insulating layers) were sampled and weight A and weight B were measured by using an automatic water adsorption and desorption measuring apparatus IGA SORP.

As a result, the water content of the organic light-emission medium was 0.0451 wt. %. Thus, it was confirmed that to take off the water from the fluorescent medium, the planarizing layer and the first and the second intermediate insulating layers in a drying step prior to forming the organic light-emission medium was very effective to reduce the water content of the organic light-emission medium.

Note that the content of the water in the IZO pattern was measured in the same conditions as described above and it was confirmed that it was below 0.001 wt. %.

(ii) Light-emission Property Evaluation

The luminescence brightness of the organic EL element was measured in the same conditions as example 1 such as, by applying DC voltage of 10V between the lower electrode (IZO pattern, or anode) and the opposite electrode (cathode) of the obtained organic EL device and the value measured with chroma meter CS100 was 90 cd/m².

Also, the chromaticity was measured in the same emitting conditions and red color light having chromaticity of CIEX=0.61 and CIEy=0.34 in CIE chromaticity coordinates, was observed.

Note that the ratio of the light-emission pixel area to the total light-emission pixel area (100%) was 56%.

(iii) Durability Test

Two sets of the obtained organic EL device were prepared. One was placed in the room condition (atmosphere, 25° C.) and the other was placed in the constant temperature oven at 80° C. for 2 weeks respectively like example 1. The durability was evaluated from the change of the light-emission area.

As a result, the light-emission area after 2 weeks in the room condition was 0.92 and the light-emission area after 2 weeks in the constant temperature oven at 80° C. was 0.90.

From these results, it was confirmed that to keep the water content of the organic light-emission medium below the predetermined value (0.05 wt. % or less) could prevent the shrinkage of the light-emission area due to the non-emission parts or the non-emission spots at the high temperature condition (80° C.) as well as the room condition (atmosphere, 25° C.) for a long time.

Example 4

(1) Fabrication of an Organic EL Device

The organic EL device as shown in FIG. 8 was fabricated in the same manner as example 1 except that a red color filter was formed between the glass substrate and the anode (lower electrode) and DPVBi and Rubrene were used in the combination as an organic light-emission medium material and dried He was used in the drying step.

On the glass substrate, V259R (manufactured by Nippon Steel Chemical Co., Ltd.) was spin-coated as an acrylate-based negative type photo-curing material and it was dried at 80° C. for 15 minutes. Through a photo-mask having patterns which correspond to the light-emission part, a contact exposure was carried out at a dose of 600 mJ/cm² by using an exposing machine having a light source of a high-pressure mercury lamp.

Then, the unexposed photo-curing material was developed with a solution of Na₂CO₃ (conc. 2 wt. %) as a developer and the post-baking at 200° C. was further carried out in an oven to form a red color filter.

Also, when the organic light-emission medium was formed in the vacuum deposition apparatus in the same manner as described in example 1, DPVBi and Rublene were simultaneously deposited in the following deposition rate.

DPVBi: deposition rate 0.1 to 0.3 nm/sec.

Rubrene: deposition rate 0.0005 to 0.0015 nm/sec.

(2) Evaluation of the Organic EL Device (i) Water Content

In the same manner as example 1, some organic light-emission mediums (partially included the color filter and the ITO layer, the first and the second intermediate insulating layers) were sampled and the weights such as weight A and weight B were measured by using an automatic water adsorption and desorption measuring apparatus IGA SORP. As a result, the water content of the organic light-emission medium was 0.0312 wt. %.

Thus, it was confirmed that to take off the water from the color filter and the first and the second intermediate insulating layers in a drying step prior to forming the light-emission medium was very effective to reduce the water content of the organic light-emission medium.

Note that the water content of the ITO pattern was below 0.0001 wt. %.

(ii) Light-emission Property Evaluation

The luminescence brightness of the organic EL element was measured in the same conditions as example 1 by applying DC voltage of 10V between the lower electrode (ITO pattern, or anode) and the opposite electrode (cathode) of the obtained organic EL device. The measured value by chroma meter CS100 was 50 cd/m$^2$.

Also, the chromaticity was measured in the same emitting conditions and red color light having chromaticity of CIEx=0.65 and CIEy=0.32 in CIE chromaticity coordinates, was observed.

Note that the ratio of the light-emission pixel area to the total light-emission pixel area (100%) was 56%.

(iii) Durability Test

Two sets of the obtained organic EL device were prepared. One was placed in the room condition (atmosphere, 25° C.) and the other was placed in the constant temperature oven at 80° C. for 2 weeks respectively like example 1. The durability was evaluated from the change of the light-emission area.

As a result, the light-emission area after 2 weeks in the room condition was 0.93 and the light-emission area after 2 weeks in the constant temperature oven at 80° C. was 0.92.

From these results, it was confirmed that to keep the water content of the organic light-emission medium below the predetermined value (0.05 wt. % or less) could prevent the shrinkage of the light-emission area due to the non-emission parts or the non-emission spots at the high temperature condition (80° C.) as well as the room condition (atmosphere, 25° C.) for a long time.

Example 5

(1) Fabrication of an Organic EL Device

The organic EL device as shown in FIG. 8 was fabricated in the similar configurations to that of example 3 except that a red color filter was formed between a glass substrate and a fluorescent medium.

(2) Evaluation of the Organic EL Device (i) Water Content

In the same manner as example 1, some organic light-emission mediums (partially included the color filter, the fluorescent medium, the planarizing layer, the IZO layer and the first and the second intermediate insulating layers) were sampled and the weights such as weight A and weight B were measured by using an automatic water adsorption and desorption measuring apparatus IGA SORP.

As a result, the water content of the organic luminescence medium was 0.0385 wt. %. Thus, it was confirmed that to take off the water from the color filter, the fluorescent medium, the planarizing layer, and the first and the second intermediate insulating layers in a drying step prior to forming the light-emission medium was very effective to reduce the water content of the organic light-emission medium.

Note that the water content of the IZO pattern was below 0.0001 wt. %.

(ii) Light-emission Property Evaluation

The luminescence brightness of the organic EL element was measured in the same conditions as example 1 by applying DC voltage of 10V between the lower electrode (IZO pattern, or anode) and the opposite electrode (cathode) of the obtained organic EL device. The measured value by a color meter CS100 was 70 cd/M$^2$.

Also, the chromaticity was measured in the same emitting conditions and red color light having chromaticity of CIEx=0.65 and CIEy=0.32 in CIE chromaticity coordinates, was observed.

Note that the ratio of the light-emission pixel area to the total light-emission pixel area (100%) was 56%.

(iii) Durability Test

Two sets of the obtained organic EL device were prepared. One was placed in the room condition (atmosphere, 25° C.) and the other was placed in the constant temperature oven at 80° C. for 2 weeks respectively in the same conditions as example 1. The durability was evaluated from the change of the light-emission area.

As a result, the light-emission area after 2 weeks in the room condition was 0.94 and the light-emission area after 2 weeks in the constant temperature oven at 80° C. was 0.91.

From these results, it was confirmed that to keep the water content of the organic light-emission medium below the predetermined value (0.05 wt. % or less) could prevent the shrinkage of the light-emission area due to the non-emission parts or the non-emission spots at the high temperature condition (80° C.) as well as the room condition (atmosphere, 25° C.) for a long time.

Example 6

(1) Fabrication of an Organic EL Device

The organic EL device as shown in FIG. 10 was fabricated in the similar configurations to that of example 2 except that Cr/ITO double layer was provided in stead of IZO layer as an anode (lower electrode) and a fluorescent medium was formed between a sealing substrate and a cathode instead of between a glass substrate and an anode.

Thus, a Cr layer with thickness of 200 nm was formed onto a glass substrate (OA2, manufactured by Nippon Electric Glass Co., Ltd.) by using a sputtering method and an ITO layer with thickness of 130 nm was formed on the Cr layer by using a sputtering method. Then, a positive type photo-resist HPR204 was spin-coated on the ITO layer and was dried at 80° C. for 15 minutes.

Then, through a photo-mask having striped patterns (line width: 90 μm, line gap: 20 μm), a contact exposure was carried out at a dose of 100 mJ/cm$^2$ by using an exposing machine having a light source of a high-pressure mercury lamp. The unexposed photo-resist was developed with a solution of TMAH as a developer.

Then, after carrying out the post-baking at 130° C. in an oven, the exposed ITO layer was etched by using an etching solution (etchant) of an aqueous solution of hydrogen bromide (conc. 47 wt. %), the exposed Cr layer was further etched by using HCE (manufactured by NAGASE & Co., Ltd.) which was nitric acid cerium ammonium/hydrogen perchlorate aqueous solution.

After that, the positive type photo-resist was removed by using a removing solution N303 to form stripe-shaped Cr/ITO patterns (line numbers: 960) as an anode (lower electrode) as well as forming a first and a second intermediate insulating layers on such anode.

A drying step was carried out in the same manner as example 2 except that the dried Argon was used as an inert gas. Also, a hole injection layer, a light-emission medium, an electron injection layer and a cathode (upper electrode) were formed in the same manner as example 2 to fabricate an organic EL element.

In forming the cathode, Alq and Li were deposited simultaneously in the deposition rate of 0.1 to 0.3 nm/sec. and 0.005 nm/sec. respectively and the IZO layer having a thickness of 200 nm was deposited on them.

On the contrary, the fluorescent medium composition (fluorescent medium ink) which was used in example 2 was spin-coated onto a sealing glass (soda lime glass, manufactured by GEOMATEC COMPANY, LIMITED) having a dimension of 1.1 mm (thickness)×95 mm (length)×128 mm (width) was dried at 80° C. for 15 minutes. Through a photo-mask corresponding to the display pattern, ultra violet ray (wave length: 365 nm) was irradiated at a dose of 1500 mJ/cm$^2$ and the fluorescent medium composition was photo-cured to form a fluorescent part (color changing part). Non-exposure part of the fluorescent medium composition was developed with a developer (2 wt. % of KOH solution).

Then, the post-baking was carried out at 160° C. for 30 minutes to produce the sealing glass having the fluorescent medium with a thickness of 20 µm. At this stage, the sealing glass having the fluorescent medium was placed and dried in the drying box in the same manner as example 2 except that the dried Argon was used as an inert gas.

Then, in the drying box, the sealing glass having the fluorescent medium was laminated onto the cathode (upper electrode) of the organic EL element and its surroundings were sealed with a photo-curing type adhesive to produce the organic EL device as shown in FIG. 10.

(2) Evaluation of the Organic EL Device (i) Water Content

In the same manner as example 1, some light-emission mediums (partially included the first and the second intermediate insulating layers) were sampled and the weight A and weight B were measured by using an automatic water adsorption and desorption measuring apparatus IGA SORP. As a result, the water content of the organic light-emission medium was 0.0210 wt. %.

Thus, it was confirmed that to take off the water from the fluorescent medium and the first and the second intermediate insulating layers in a drying step prior to forming the organic light-emission medium was very effective to reduce the water content of the organic light-emission medium.

(ii) Light-emission Property Evaluation

The luminescence brightness of the organic EL element was measured in the same conditions as example 1 by applying DC voltage of 10V between the lower electrode (Cr/ITO pattern, or anode) and the opposite electrode (upper electrode, cathode) of the obtained organic EL device. The measured value by a color meter CS100 was 80 cd/m$^2$.

Also, the chromaticity was measured in the same emitting conditions and red color light having chromaticity of CIEx=0.60 and CIEy=0.34 in CIE chromaticity coordinates, was observed.

Note that the ratio of the light-emission pixel area to the total light-emission pixel area (100%) was 56%.

(iii) Durability Test

Two sets of the obtained organic EL device were prepared. One was placed in the room condition (atmosphere, 25° C.) and the other was placed in the constant temperature oven at 80° C. for 2 weeks respectively like example 1. The durability was evaluated from the change of the light-emission area.

As a result, the light-emission area after 2 weeks in the room condition was 0.93 and the light-emission area after 2 weeks in the constant temperature oven at 80° C. was 0.91.

From these results, it was confirmed that to keep the water content of the organic light-emission medium below the predetermined value (0.05 wt. % or less) could prevent the shrinkage of the light-emission area due to the non-emission parts or the non-emission spots at the high temperature condition (80° C.) as well as the room condition (atomosphere, 25° C.) for a long time.

Example 7

(1) Fabrication of an Organic EL Device

The organic EL device as shown in FIG. 10 was fabricated in the similar configurations to that of example 6 except a red color filter which was same as example 4 was provided on the sealing glass substrate in place of a fluorescent medium on the sealing glass, and the organic light-emission medium was fabricated in the same manner as example 4.

(2) Evaluation of the Organic EL Device (i) Water Content

In the same manner as example 1, some organic light-emission mediums (partially included the first and the second intermediate insulating layers) were sampled and the weight A and weight B were measured by using an automatic water adsorption and desorption measuring apparatus IGA SORP. As a result, the water content of the organic light-emission medium was 0.0153 wt. %.

Thus, it was confirmed that to take off the water from the color filter and the first and the second intermediate insulating layers in a drying step prior to forming the organic light-emission medium was very effective to reduce the water content of the organic light-emission medium.

(ii) Light-emission Property Evaluation

The luminescence brightness of the organic EL element was measured in the same conditions as example 1 by applying DC voltage of 10V between the lower electrode (Cr/ITO pattern, or anode) and the opposite electrode (lower electrode, cathode) of the obtained organic EL device. The value measured by a color meter CS100 was 40 cd/m$^2$.

Also, the chromaticity was measured in the same emitting conditions and red color light having chromaticity of CIEx=0.65 and CIEy=0.34 in CIE chromaticity coordinates, was observed.

Note that the ratio of the light-emission pixel area to the total light-emission pixel area (100%) was 56%.

(iii) Durability Test

Two sets of the obtained organic EL device were prepared. One was placed in the room condition (atmosphere, 25° C.) and the other was placed in the constant temperature oven at 80° C. for 2 weeks respectively in the same conditions as example 1. The durability was evaluated from the change of the light-emission area.

As a result, the light-emission area after 2 weeks in the room condition was 0.93 and the light-emission area after 2 weeks in the constant temperature oven at 80° C. was 0.91.

From these results, it was confirmed that to keep the water content of the organic light-emission medium below the predetermined value (0.05 wt. % or less) could prevent the shrinkage of the light-emission area or the light-emission spot at the high temperature condition (80° C.) as well as at the room condition (atmosphere, 25° C.) for a long time.

Example 8

(1) Fabrication of an Organic EL Device (i) Formation of an Anode and an Intermediate Insulating Layer An anode, a first intermediate insulating layer and a second intermediate insulating layer (separating wall) were formed on the glass substrate (OA2) in the same manner as example 1.

(ii) Wet Forming of an Organic Light-emission Medium

Then, an organic light-emission medium of an organic EL element was formed from the following ink by using an ink-jet method as a wet forming process. Thus, the following ink was spouted out from a head of an ink-jet printer and was coated onto the opening of the first intermediate insulating layer. After that, it was heated at 150° C. for 4 hours in N$_2$ to take off the water and the solvent as well as to polymerize a precursor of PPV to produce an organic light-emission medium.

| | |
|---|---|
| poly p-phenylenevinylene (PPV) precursor | 0.3750 wt. % |
| glycerin | 5.0000 wt. % |
| diethylene glycol | 10.000 wt. % |
| water | 1.2235 wt. % |
| methanol | 23.3940 wt. % |
| N,N-dimetylformamide | 60.0000 wt. % |
| Rhodamine B | 0.0075 wt. % |

(iii) Forming of an Electron Injection Layer

Then, the glass substrate having an organic light-emission medium was fixed onto the holder in the vacuum deposition apparatus. Tris(8-quinolinol)Aluminium (Alq) was placed on molybdenum heating boat in the vacuum deposition apparatus and an electron injection layer having a thickness of 20 nm was formed in the condition that the evacuated pressure was $665 \times 10^{-7}$ Pa ($5 \times 10^{-7}$ Torr) and the deposition rate was 0.1 to 0.3 nm/sec.

(iv) Drying Step

The glass substrate obtained in the above (iii) was conveyed to a drying unit to carry out the drying step. Such glass substrate in the drying box was heated at 60° C. by using a hot plate. By introducing dried $N_2$ into the drying box to keep the dew point at −50° C. and maintaining the conditions for about 2 hours, the water contained in the light-emission medium, the first and the second intermediate insulating layers and the glass surface and the like were taken off.

(v) Forming of a Cathode

The glass substrate obtained in the above (iv) was fixed onto the holder in the vacuum deposition apparatus. As an opposite electrode (cathode) material, Al—Li alloy (Li content 10 atm. %) was placed on a tungsten filament. In the condition that the evacuated pressure was $665 \times 10^{-7}$ Pa ($5 \times 10^{-7}$ Torr) and the deposition rate was 0.5 to 1.0 nm/sec, the striped cathode (line number: 240) having a thickness of 150 nm was formed to produce an organic EL element.

(vi) Sealing Step

Next, an organic EL element was placed in a drying box introduced with a dried $N_2$ gas, and a sealing glass (soda lime glass, manufactured by GEOMATEC COMPANY, LIMITED) was laminated onto a light-emission part and its surroundings were sealed with a photo-curing type adhesive TB3102 (manufactured by Threebond Co., Ltd.).

By constituting like this, the organic EL device having a X-Y matrix of a lower electrode and an upper electrode as shown in FIG. 2 was obtained.

(2) Evaluation of the Organic EL Device (i) Water Content

In the same manner as example 1, some organic light-emission mediums were sampled and the weight A and weight B were measured by using an automatic water adsorption and desorption measuring apparatus IGA SORP. As a result, the water content of the light-emission medium was 0.0301 wt. %. Thus, it was confirmed that to take off the water from the organic light-emission medium and the first and the second intermediate insulating layers could be available, even if the organic light-emission medium was formed by using a wetting process.

(ii) Light-emission Property Evaluation

The luminescence brightness of the organic EL element was measured in the same conditions as example 1 by applying DC voltage of 10V between the lower electrode (ITO pattern, or anode) and the opposite electrode (lower electrode, cathode) of the obtained organic EL device. The luminescence brightness value measured by chroma meter CS100 was 50 cd/m$^2$.

Also, the chromaticity was measured in the same emitting conditions and red color light having chromaticity of CIEx=0.58 and CIEy=0.34 in CIE chromaticity coordinates, was observed.

Note that the ratio of the light-emission pixel area to the total light-emission pixel area (100%) was 56%.

(iii) Durability Test

Two sets of the obtained organic EL device were prepared. One was placed in the room condition (atmosphere, 25° C.) and the other one was placed in the constant temperature oven at 80° C. for 2 weeks respectively like example 1. The durability was evaluated from the change of the light-emission area.

As a result, the light-emission area after 2 weeks in the room condition was 0.92 and the light-emission area after 2 weeks in the constant temperature oven of 80° C. was 0.90.

From these results, it was confirmed that to keep the water content of the organic light-emission medium below the predetermined value (0.05 wt. % or less) could prevent the shrinkage of the light-emission area due to the non-emission parts or the non-emission spots at the high temperature condition (80° C.) as well as at the room condition (atmosphere, 25° C.) for a long time, even if the organic light-emission medium was formed by using a wetting process.

Example 9

The organic EL device was fabricated in the same manner of example 5 which provided a color filter, a fluorescent medium and a planarizing layer except that the heating temperature was 120° C. in stead of 60° C. and thus obtained organic EL device was evaluated. The obtained results were shown in table 2.

From these data, it was confirmed that heating temperature at 100° C. or more in the drying step could reduce the water content of the organic light-emission medium to be 0.0098 wt. % which was below 0.01 wt. %.

When the organic EL device was in the room condition (atmosphere, 25° C.) for 2 weeks, the light-emission area became 0.95 based on the initial area. When the organic EL device was in the constant temperature oven at 80° C. for 2 weeks, the light-emission area became 0.95 based on the initial area.

From these data, the water content of the organic light-emission medium can be less than 0.01 wt. % by heating the glass substrate at 100° C. or more in the drying step, even if a color filter, a fluorescent medium and a planarizing layer were provided. Consequently, it was confirmed that to keep the water content of the organic light-emission medium below the predetermined value (0.05 wt. % or less) could prevent the shrinkage of the light-emission area due to the non-emission parts or the non-emission spots at the high temperature condition (80° C.) as well as at the room condition (atmosphere, 25° C.) for a long time.

Example 10

The organic EL device was fabricated in the same manner as example 5 which provided a color filter, a fluorescent medium and a planarizing layer except that the heating temperature was 160° C. in stead of 60° C. and thus obtained organic EL device was evaluated. The obtained results were shown in table 2.

From these results, it was confirmed that heating temperature of the glass substrate at 150° C. or more in the drying step could reduce the water content of the organic light-emission medium to be 0.0006 wt. % which was below 0.001 wt. %.

When the organic EL device was in the room condition (atmosphere, 25° C.) for 2 weeks, the light-emission area became 0.98 based on the initial area. When the organic EL device was in the constant temperature oven at 80° C. for 2 weeks, the light-emission area became 0.97 based on the initial area.

From these results, the water content of the organic light-emission medium can be less than 0.001 wt. % by heating the glass substrate at 150° C. or more in the drying step, even if a color filter, a fluorescent medium and a planarizing layer were provided. Consequently, it was confirmed that to keep the water content of the organic light-emission medium below the predetermined value (0.05 wt. % or less) could prevent the shrinkage of the light-emission area due to the non-emission parts or the non-emission spots at the high temperature condition (80° C.) as well as at the room condition (atmosphere, 25° C.) for a long time.

Example 11

The organic EL device was fabricated in the same manner as example 5 which provided a color filter, a fluorescent medium and a planarizing layer except that the dew point was −10° C. in stead of −50° C. and thus obtained organic EL device was evaluated. The obtained results were shown in table 3.

From these results, it was confirmed that the water content of the organic light-emission medium could be 0.0495 wt. % which was below 0.05 wt. %.by controlling the dew point at −10° C or less in the drying step.

When the organic EL device was in the room condition (atmosphere, 25° C.) for 2 weeks, the light-emission area became 0.90 based on the initial area. When the organic EL device was in the constant temperature oven at 80° C. for 2 weeks, the light-emission area became 0.87 based on the initial area.

From these data, the water content of the organic light-emission medium can be less than 0.05 wt. % by keeping the dew point at −10° C. or less in the drying step, even if a color filter, a fluorescent medium and a planarizing layer were provided. Consequently, it was confirmed that to keep the water content of the organic light-emission medium below the predetermined value (0.05 wt. % or less) could prevent the shrinkage of the light-emission area due to the non-emission parts or the non-emission spots at the high temperature condition (80° C.) as well as at the room condition (atmosphere, 25° C.) for a long time.

Example 12

The organic EL device was fabricated in the same manner as example 5 which provided a color filter, a fluorescent medium and a planarizing layer except that the dew point in the drying step (drying box) was −50° C. without heating by using a hot plate and thus obtained organic EL device was evaluated. The obtained results were shown in table 3.

From these results, it was confirmed that to keep the dew point at −50° C. or less in the drying step could reduce the water content of the organic light-emission medium to be 0.0450 wt. % which was below 0.05 wt. %, even if the heating step for the glass plate was not carried out.

When the organic EL device was in the room condition (atmosphere, 25° C.) for 2 weeks, the light-emission area became 0.91 based on the initial area. When the organic EL device was in the constant temperature oven at 80° C. for 2 weeks, the light-emission area became 0.87 based on the initial area.

Also, from these data, the water content of the organic light-emission medium can be less than 0.05 wt. % by keeping the dew point at −50° C. or less in the drying step, even if a color filter, a fluorescent medium and a planarizing layer were provided and the heating step for the glass plate was not carried out.

Consequently, it was confirmed that to keep the water content of the organic light-emission medium below the predetermined value (0.05 wt. % or less) could prevent the shrinkage of the light-emission area due to the non-emission parts or the non-emission spots at the high temperature condition (80° C.) as well as at the room condition (atmosphere, 25° C.) for a long time.

Example 13

The organic EL device was fabricated in the same manner as example 4 which provided a color filter except that the dew point was maintained at −50° C. with heating for the glass substrate at 250° C. by using a hot plate while introducing the dried $N_2$ in the drying step (drying box) and thus obtained organic EL device was evaluated. The obtained results were shown in table 3.

From these results, the water content of the organic light-emission medium could be 0.0006 wt. % which was less than 0.001 wt. % by heating the glass substrate at 100° C. or more with a hot plate while introducing the dried $N_2$ into the drying step.

When the organic EL device was in the room condition (atmosphere, 25° C.) for 2 weeks, the light-emission area became 0.99 based on the initial area. When the organic EL device was in the constant temperature oven at 80° C. for 2 weeks, the light-emission area became 0.98 based on the initial area.

From these data, the water content of the organic light-emission medium can be less than 0.001 wt. % by heating the glass substrate at 100° C. or more with a hot plate while introducing the dried $N_2$ into the drying step, even if a color filter was provided. Consequently, it was confirmed that to keep the water content of the organic light-emission medium below the predetermined value could remarkably prevent the shrinkage of the light-emission area due to the non-emission parts or the non-emission spots at the high temperature condition (80° C.) as well as at the room condition (atmosphere, 25° C.) for a long time.

Example 14

The organic EL device was fabricated in the same manner as example 5 which provided a color filter, a fluorescent medium and a planarizing layer except that evacuated pressure was $133 \times 10^{-5}$ Pa ($1 \times 10^{-5}$ Torr) and the dew point was not controlled without heating nor introducing the dried $N_2$ in the drying step (drying box) and thus obtained organic EL device was evaluated. The obtained results were shown in table 3.

From these results, the water content of the organic light-emission medium could be 0.0238 wt. % which was less than 0.05 wt. % by adjusting the evacuated pressure in the drying step.

When the organic EL device was in the condition of room condition (atmosphere, 25° C.) for 2 weeks, the light-emission area became 0.91 based on the initial area. When the organic EL device was in the condition of 80° C. in the constant temperature oven for 2 weeks, the light-emission area became 0.88 based on the initial area.

Thus, the water content of the organic light-emission medium can be 0.05 wt. % or less by adjusting the evacuated pressure in the drying step, even if a color filter, a fluorescent medium and a planarizing layer were provided. Consequently, it was confirmed that to keep the water content of the organic light-emission medium below the predetermined value could prevent the shrinkage of the light-emission area due to the non-emission parts or the non-emission spots at the high temperature condition (80° C.) as well as at the room condition (atmosphere, 25° C.) for a long time.

Example 15

The organic EL device was fabricated in the same manner as example 5 which provided a color filter, a fluorescent medium and a planarizing layer except that evacuated pressure was $133 \times 10^{-5}$ Pa ($1 \times 10^{-5}$ Torr) while heating at 160° C. by using a hot plate, the dew point was not being maintained at −50° C. nor introducing the dried $N_2$ in the drying step (drying box) and thus obtained organic EL device was evaluated. The obtained results were shown in table 3.

From these results, the water content of the organic light-emission medium could be 0.0006 wt. % which was less than 0.001 wt. % by adjusting the evacuated pressure and the heating temperature in the drying step.

When the organic EL device was in the room condition (atmosphere, 25° C.) for 2 weeks, the light-emission area became 0.99 based on the initial area. When the organic EL device was in the condition of 80° C. in the constant temperature oven for 2 weeks, the light-emission area became 0.98 based on the initial area.

Thus, the water content of the organic light-emission medium can be 0.001 wt. % or less by adjusting the evacuated pressure and heating temperature in the drying step, even if a color filter, a fluorescent medium and a planarizing layer were provided. Consequently, it was confirmed that to keep the water content of the organic light-emission medium below the predetermined value could prevent the shrinkage of the light-emission area due to the non-emission parts or the non-emission spots at the high temperature condition (80° C.) as well as at the room condition (atmosphere, 25° C.) for a long time.

Example 16

The organic EL device was fabricated in the same manner as example 5 which provided a color filter, a fluorescent medium and a planarizing layer except that evacuated pressure was $133 \times 10^{-1}$ Pa ($1 \times 10^{-1}$ Torr) without adjusting the dew point, heating nor introducing the dried $N_2$ in the drying step (drying box) and thus obtained organic EL device was evaluated. The obtained results were shown in table 3.

From these results, the water content of the organic light-emission medium could be 0.0488 wt. %, which was less than 0.05 wt. % by adjusting the evacuated pressure suitably in the drying step.

When the organic EL device was in the room condition (atmosphere, 25° C.) for 2 weeks, the light-emission area became 0.91 based on the initial area. When the organic EL device was in the condition of 80° C. in the constant temperature oven for 2 weeks, the light-emission area became 0.85 based on the initial area.

Thus, the water content of the organic light-emission medium can be 0.05 wt. % or less by adjusting the evacuated pressure suitably in the drying step, even if a color filter, a fluorescent medium and a planarizing layer were provided. Consequently, it was confirmed that to keep the water content of the organic light-emission medium below the predetermined value could prevent the shrinkage of the light-emission area due to the non-emission parts or the non-emission spots at the high temperature condition (80° C.) as well as at the room condition (atmosphere, 25° C.) for a long time.

Comparative Example 1

The organic EL device was fabricated in the same manner as example 1 except that the drying step was not carried out prior to the formation of the light-emission layer and thus obtained organic EL device was evaluated. The obtained results were shown in table 4.

As understood from these results, the water content of the organic light-emission medium was 0.0713 wt. % and it was impossible for such water content to be 0.05 wt. % or less since there was no drying step.

When the organic EL device was in the room condition (atmosphere, 25° C.) for 2 weeks, the light-emission area became 0.80 based on the initial area. When the organic EL device was in the condition of 80° C. in the constant temperature oven for 2 weeks, the light-emission area became 0.55 based on the initial area.

Thus, the water content of the organic light-emission medium cannot be 0.05 wt. % or less since there was no drying step prior to forming of the organic EL element. Consequently, it was confirmed that the shrinkage of the light-emission area due to the occurrence of the non-emission parts and the non-emission spots could not be prevented at the room condition (atmosphere, 25° C.) and the high temperature condition (80° C.) for 2 weeks.

Comparative Example 2

The organic EL device was fabricated in the same manner as example 5 which provided a color filter, a fluorescent medium and a planarizing layer except that the drying step was not carried out prior to the formation of the light-emission layer and thus obtained organic EL device was evaluated. The obtained results were shown in table 4.

As understood from these results, the water content of the organic light-emission medium was 0.3215 wt. % and it was impossible for such water content to be 0.05 wt. % or less since there was no drying step.

When the organic EL device was in the room condition (atmosphere, 25° C.) for 2 weeks, the light-emission area became 0.33 based on the initial area. When the organic EL device was in the condition of 80° C. in the constant temperature oven for 2 weeks, the light-emission area became 0.15 based on the initial area.

Thus, the water content of the organic light-emission medium cannot be 0.05 wt. % or less since there was no drying step prior to forming of the organic EL element. Consequently, it was confirmed that the shrinkage of the light-emission area due to the non-emission parts and the non-emission spots could not be prevented at the room condition (atmosphere, 25° C.) and the high temperature condition (80° C.) for 2 weeks.

Comparative Example 3

The organic EL device was fabricated in the same manner as example 5 which provided a color filter, a fluorescent medium and a planarizing layer except that the drying step was slightly carried out by introducing the dried $N_2$, keeping the dew point at 0° C., and maintaining the room temperature for 2 hours prior to the formation of the light-emission layer and thus obtained organic EL device was evaluated. The obtained results were shown in table 4.

From these results, the water content of the organic light-emission medium was 0.1001 wt. % and it was impossible such water content should be 0.05 wt. % or less since the drying condition was insufficient.

When the organic EL device was in the room condition (atmosphere, 25° C.) for 2 weeks, the light-emission area became 0.60 based on the initial area. When the organic EL device was in the condition of 80° C. in the constant temperature oven for 2 weeks, the light-emission area became 0.30 based on the initial area.

Thus, the water content of the organic light-emission medium cannot be 0.05 wt. % or less since the drying condition was insufficient in the drying step prior to forming of the organic EL element. Consequently, it was revealed that the shrinkage of the light-emission area due to the non-emission parts and the non-emission spots could not be prevented at the both of room condition (atmosphere, 25° C.) and the high temperature condition (80° C.) for 2 weeks.

Comparative Example 4

The organic EL device was fabricated in the same manner as example 4 which provided a color filter except that the drying step was not carried out prior to the formation of an organic EL element and thus obtained organic EL device was evaluated. The obtained results were shown in table 4.

From these results, the water content of the organic light-emission medium was 0.0821 wt. % and it was impossible that the water content should be 0.05 wt. % or less since there was no drying step.

When the organic EL device was in the room condition (atmosphere, 25° C.) for 2 weeks, the light-emission area became 0.75 based on the initial area. When the organic EL device was in the condition of 80° C. in the constant temperature oven for 2 weeks, the light-emission area became 0.45 based on the initial area.

Thus, the water content of the organic light-emission medium cannot be 0.05 wt. % or less since there was no drying step prior to forming of the organic EL element. Consequently, it was revealed that the shrinkage of the light-emission area due to the non-emission parts and the non-emission spots could not be prevented at both of the room condition (atmosphere, 25° C.) and the high temperature condition (80° C.) for 2 weeks.

Comparative Example 5

The organic EL device was fabricated in the same manner as example 8 in which the light-emission layer was formed by a wetting process except that the drying step was not carried out prior to the formation of the cathode of the organic EL element and thus obtained organic EL device was evaluated. The obtained results were shown in table 4.

From these results, the water content of the organic light-emission medium was 0.1234 wt. % and it was impossible that such water should be 0.05 wt. % or less since there was no drying step prior to the forming of the cathode of the organic EL element.

When the organic EL device was in the room condition (atmosphere, 25° C.) for 2 weeks, the light-emission area became 0.55 based on the initial area. When the organic EL device was in the condition of 80° C. in the constant temperature oven for 2 weeks, the light-emission area became 0.42 based on the initial area.

Thus, the water content of the organic light-emission medium cannot be 0.05 wt. % or less since there was no drying step prior to forming of the cathode of the organic EL element. Consequently, it was confirmed that the shrinkage of the light-emission area due to the non-emission parts and the non-emission spots could not be prevented at the both of room condition (atmosphere, 25° C.) and the high temperature condition (80° C.) for 2 weeks.

Comparative Example 6

The organic EL device was fabricated in the same manner as example 6 except that the drying step was not carried out prior to the formation of the cathode of the organic EL element and thus obtained organic EL device was evaluated. The obtained results were shown in table 5.

From these results, the water content of the organic light-emission medium was 0.1230 wt. % and it was impossible that such water content should be 0.05 wt. % or less since there was no drying step prior to the forming of the cathode of the organic EL element.

When the organic EL device was in the room condition (atmosphere, 25° C.) for 2 weeks, the light-emission area became 0.40 based on the initial area. When the organic EL device was in the condition of 80° C. in the constant temperature oven for 2 weeks, the light-emission area became 0.25 based on the initial area.

Thus, the water content of the organic light-emission medium cannot be 0.05 wt. % or less since there was no drying step prior to forming of the cathode of the organic EL element. Consequently, it was confirmed that the shrinkage of the light-emission area due to the non-emission parts and the non-emission spots could not be prevented at both of the room condition (atmosphere, 25° C.) and the high temperature condition (80° C.) for 2 weeks.

Comparative Example 7

The organic EL device was fabricated in the same manner as example 1 except that the insufficient drying step was carried out by heating at 60° C., for 30 minutes after the formation of the cathode of the organic EL element and thus obtained organic EL device was evaluated. The obtained results were shown in table 5.

As understood from these results, the drying step after the forming of the cathode of the organic EL element was insufficient and the water content of the organic light-emission medium was more than 0.1 wt. %. When the organic EL device was in the room condition (atmosphere, 25° C.) for 2 weeks, the light-emission area became 0.53 based on the initial area. When the organic EL device was in the condition of 80° C. in the constant temperature oven for 2 weeks, the light-emission area became 0.40 based on the initial area.

Thus, the water content of the organic light-emission medium cannot be 0.05 wt. % or less since the drying condition was insufficient in the drying step after forming of the cathode of the organic EL element. Consequently, it was confirmed that the shrinkage of the light-emission area due to the non-emission parts and the non-emission spots could not be prevented at both of the room condition (atmosphere, 25° C.) and the high temperature condition (80° C.) for 2 weeks.

Comparative Example 8

The organic EL device was fabricated in the same manner as example 3 except that the drying step was not carried out prior to the formation of the organic EL element even though $SiO_2$ layer (thickness 200 μm) was provided between a planarizing layer and a lower electrode as a moisture protective layer by using a sputtering method, and thus obtained organic EL device was evaluated. The obtained results were shown in table 5.

From these results, the water content of the organic light-emission medium was more than 0.1 wt. % since there was no drying step.

When the organic EL device was in the room condition (atmosphere, 25° C.) for 2 weeks, the light-emission area became 0.40 based on the initial area. When the organic EL device was in the condition of 80° C. in the constant temperature oven for 2 weeks, the light-emission area became 0.20 based on the initial area.

Thus, the water content of the organic light-emission medium cannot be 0.05 wt. % or less since there was no drying step prior to forming of the organic EL element. Consequently, it was confirmed that the shrinkage of the light-emission area due to the non-emission parts and the non-emission spots could not be prevented at the room condition (atmosphere, 25° C.) and the high temperature condition (80° C.) for 2 weeks.

TABLE 1

|  | Example 1 | Example 2 | Example 3 | Example 4 | Example 5 |
|---|---|---|---|---|---|
| Color Filter | No | No | No | Yes | Yes |
| Fluorescent Medium | No | Yes | Yes | No | Yes |
| Planarizing Layer | No | No | Yes | No | Yes |
| Anode (lower electrode) | ITO | IZO | IZO | ITO | IZO |
| Hole Injection Layer | MT-DATA/NPD | MT-DATA/NPD | MT-DATA/NPD | MT-DATA/NPD | MT-DATA/NPD |
| Light-emission Layer | DPVBi | DPVBi | DPVBi | DPVBi/Rubrene | DPVBi |
| Electron Injection Layer | Alq | Alq | Alq | Alq | Alq |
| Cathode (Upper electrode) | Al/Li | Al/Li | Al/Li | Al/Li | Al/Li |
| Sealing Glass | Yes | Yes | Yes | Yes | Yes |
| Drying Step | Dewpoint −50° C., $N_2$, 60° C. heat | Dewpoint −50° C., $N_2$, 60° C. heat | Dewpoint −50° C., $N_2$, 60° C. heat | Dewpoint −50° C., He, 60° C. heat | Dewpoint −50° C., $N_2$, 60° C. heat |
| Water Content (wt. %) | 0.0009 | 0.0306 | 0.0451 | 0.0312 | 0.0385 |
| Luminescence Brightness ($cd/m^2$) | 300 | 90 | 90 | 50 | 70 |
| CIEx | 0.15 | 0.61 | 0.61 | 0.65 | 0.65 |
| CIEy | 0.18 | 0.34 | 0.34 | 0.32 | 0.32 |
| Area Ratio at RT for 2 Weeks | 0.98 | 0.93 | 0.92 | 0.93 | 0.94 |
| Area Ratio at 80° C. for 2 Weeks | 0.97 | 0.90 | 0.90 | 0.92 | 0.91 |
| Luminescence Brightness at RT for 2 Weeks ($cd/m^2$) | 294 | 83.7 | 82.8 | 46.5 | 65.8 |
| Luminescence Brightness at 80° C., for 2 Weeks ($cd/m^2$) | 291 | 81 | 81 | 46 | 63.7 |

TABLE 2

|  | Example 6 | Example 7 | Example 8 | Example 9 | Example 10 |
|---|---|---|---|---|---|
| Color Filter | No | Yes | No | Yes | Yes |
| Fluorescent Medium | Yes | No | No | Yes | Yes |
| Planarizing Layer | No | No | No | Yes | Yes |
| Anode (lower electrode) | Cr/ITO | Cr/ITO | ITO | IZO | IZO |
| Hole Injection Layer | MT-DATA/NPD | MT-DATA/NPD | — | MT-DATA/NPD | MT-DATA/NPD |
| Light-emission Layer | DPVBi | DPVBi Rubrene | WetPPV | DPVBi/ | DPVBi |
| Electron Injection Layer | Alq | Alq | Alq | Alq | Alq |
| Cathode (Upper electrode) | IZO/Alq/Li | IZO/Alq/Li | Al/Li | Al/Li | Al/Li |
| Sealing Glass | Yes | Yes | Yes | Yes | Yes |
| Drying Step | Dewpoint −50° C., Ar, 60° C. heating | Dewpoint −50° C., Ar, 60° C. heating | Dewpoint −50° C., $N_2$, 60° C. heating | Dewpoint −50° C., $N_2$, 120° C. heating | Dewpoint −50° C., $N_2$, 160° C. heating |
| Water Content (wt. %) | 0.0210 | 0.0153 | 0.0301 | 0.0098 | 0.0006 |
| Luminescence Brightness ($ca/m^2$) | 80 | 40 | 50 | 70 | 70 |
| CIEx | 0.60 | 0.65 | 0.58 | 0.65 | 0.65 |
| CIEy | 0.34 | 0.32 | 0.34 | 0.32 | 0.32 |
| Area Ratio at RT for 2 Weeks | 0.93 | 0.93 | 0.92 | 0.95 | 0.98 |
| Area Ratio at 80° C. for 2 Weeks | 0.91 | 0.91 | 0.90 | 0.95 | 0.97 |
| Luminescence Brightness at RT for 2 Weeks ($cd/m^2$) | 74.4 | 37.2 | 46 | 66.5 | 68.6 |
| Luminescence Brightness at 80° C., for 2 Weeks ($cd/m^2$) | 72.8 | 36.4 | 45 | 66.5 | 65.1 |

TABLE 3

| | Example 11 | Example 12 | Example 13 | Example 14 | Example 15 | Example 16 |
|---|---|---|---|---|---|---|
| Color Filter | Yes | Yes | Yes | Yes | Yes | Yes |
| Fluorescent Medium | Yes | Yes | Yes | Yes | Yes | Yes |
| Planarizing Layer | Yes | Yes | Yes | Yes | Yes | Yes |
| Anode (lower electrode) | IZO | IZO | ITO | IZO | IZO | IZO |
| Hole Injection Layer | MTDATA/ NPD | MTDATA/ NPD | MTDATA/ NPD | MTDATA/ NPD | MTDATA/ NPD | MTDATA/ NPD |
| Light-emission Layer | DPVBi | DPVBi | DPVBi/ Rubrene | DPVBi | DPVBi | DPVBi |
| Electron Injection Layer | Alq | Alq | Alq | Alq | Alq | Alq |
| Cathode (Upper electrode) | Al/Li | Al/Li | Al/Li | Al/Li | Al/Li | Al/Li |
| Sealing Glass | Yes | Yes | Yes | Yes | Yes | Yes |
| Drying Step | Dewpoint −10° C., $N_2$, 60° C. heat | Dewpoint −50° C., $N_2$, RT | Dewpoint −50° C. $N_2$, 250° C. heat | $133 \times 10^{-5}$ Pa, 20 Hrs | $133 \times 10^{-5}$ Pa, 20 Hrs, 160° C. heat | $133 \times 10^{-1}$ Pa, 30 Hrs, RT |
| Water Content (wt. %) | 0.0495 | 0.0450 | 0.0006 | 0.0238 | 0.0006 | 0.0488 |
| Luminescence Brightness (ca/m$^2$) | 70 | 70 | 50 | 70 | 70 | 70 |
| CIEx | 0.65 | 0.65 | 0.65 | 0.65 | 0.65 | 0.65 |
| CIEy | 0.32 | 0.32 | 0.32 | 0.32 | 0.32 | 0.32 |
| Area Ratio at RT for 2 Weeks | 0.90 | 0.91 | 0.99 | 0.91 | 0.99 | 0.91 |
| Area Ratio at 80° C. for 2 Weeks | 0.87 | 0.87 | 0.98 | 0.88 | 0.98 | 0.85 |
| Luminescence Brightness at RT for 2 Weeks (cd/m$^2$) | 63 | 63.7 | 49.5 | 63.7 | 69.3 | 63.7 |
| Luminescence Brightness at 80° C., for 2 Weeks (cd/m$^2$) | 60.9 | 60.9 | 49 | 61.6 | 68.6 | 59.5 |

TABLE 4

| | Comp. Example 1 | Comp. Example 2 | Comp. Example 3 | Comp. Example 4 | Comp. Example 5 |
|---|---|---|---|---|---|
| Color Filter | No | Yes | Yes | Yes | No |
| Fluorescent Medium | No | Yes | Yes | No | No |
| Planarizing Layer | No | Yes | Yes | No | No |
| Anode (lower electrode) | ITO | IZO | IZO | ITO | ITO |
| Hole Injection Layer | MT-DATA/ NPD | MT-DATA/ NPD | MT-DATA/ NPD | MT-DATA/ NPD | NPD |
| Light-emission Layer | DPVBi | DPVBi | DPVBi | DPVBi/ Rubrene | Wet ppv |
| Electron Injection Layer | Alq | Alq | Alq | Alq | Alq |
| Cathode (Upper electrode) | Al/Li | Al/Li | Al/Li | Al/Li | Al/Li |
| Sealing Glass | Yes | Yes | Yes | Yes | Yes |
| Drying Step | No | No | Dewpoint 0° C., $N_2$, RT | No | No |
| Water Content (wt. %) | 0.0713 | 0.3215 | 0.1001 | 0.0821 | 0.1234 |
| Luminescence Brightness (ca/m$^2$) | 300 | 70 | 70 | 50 | 50 |
| CIEx | 0.15 | 0.65 | 0.65 | 0.65 | 0.58 |
| CIEy | 0.18 | 0.32 | 0.32 | 0.32 | 0.32 |

TABLE 4-continued

|  | Comp. Example 1 | Comp. Example 2 | Comp. Example 3 | Comp. Example 4 | Comp. Example 5 |
|---|---|---|---|---|---|
| Area Ratio at RT for 2 Weeks | 0.80 | 0.33 | 0.60 | 0.75 | 0.55 |
| Area Ratio at 80° C. for 2 Weeks | 0.55 | 0.15 | 0.30 | 0.45 | 0.42 |
| Luminescence Brightness at RT for 2 Weeks (cd/m$^2$) | 240 | 23.1 | 42 | 38.5 | 27.5 |
| Luminescence Brightness at 80° C., for 2 Weeks (cd/m$^2$) | 165 | 10.5 | 21 | 22.5 | 21 |

TABLE 5

|  | Comp. Example 6 | Comp. Example 7 | Comp. Example 8 |
|---|---|---|---|
| Color Filter | No | No | No |
| Fluorescent Medium | Yes | No | Yes |
| Planarizing Layer | No | No | Yes |
| Anode (lower electrode) | Cr/ITO | ITO | IZO |
| Hole Injection Layer | MTDATA/NPD | MTDATA/NPD | MTDATA/NPD |
| Light-emission Layer | DPVBi | DPVBi | DPVBi |
| Electron Injection Layer | Alq | Alq | Alq |
| Cathode (Upper electrode) | IZO/Alq/Li | Al/Li | Al/Li |
| Sealing Glass | Yes | Yes | Yes |
| Drying Step | No | 60° C. heating after forming cathode | no |
| Barrier Layer |  |  | SiO$_2$ |
| Water Content (wt. %) | 0.1230 | >0.1 | >0.1 |
| Luminescence Brightness (ca/m$^2$) | 80 | 300 | 90 |
| CIEx | 0.60 | 0.15 | 0.61 |
| CIEy | 0.34 | 0.18 | 0.34 |
| Area Ratio at RT for 2 Weeks | 0.40 | 0.53 | 0.40 |
| Area Ratio at 80° C. for 2 Weeks | 0.25 | 0.40 | 0.20 |
| Luminescence Brightness at RT for 2 Weeks (cd/m$^2$) | 32 | 159 | 36 |
| Luminescence Brightness at 80° C., for 2 Weeks (cd/m$^2$) | 20 | 120 | 18 |

What is claimed is:

1. An organic electroluminescence device comprising a lower electrode, an organic light-emission medium and an upper electrode on a support substrate, wherein a water content of the organic light-emission medium is 0.05 wt. % or less.

2. An organic electroluminescence device comprising a lower electrode, an intermediate insulating layer, an organic light-emission medium and an upper electrode on a support substrate, wherein a water content of the intermediate insulating layer and the organic light-emission medium is 0.05 wt. % or less.

3. An organic electroluminescence device comprising each or both of a color filter and a fluorescence medium, a lower electrode, an intermediate insulating layer, an organic light-emission medium and an upper electrode on a support substrate, wherein a water content of the each or both of a color filter and a fluorescence medium, the intermediate insulating layer and the organic light-emission medium and is 0.05 wt. % or less.

4. An organic electroluminescence device comprising both of a color filter and a fluorescence medium or each, a planarizing layer, a lower electrode, an intermediate insulating layer, an organic light-emission medium and an upper electrode on a support substrate, wherein a water content of the each or both of the color filter and the fluorescence medium, the planarizing layer, the intermediate insulating layer and the organic light-emission medium is 0.05 wt. % or less.

5. A method for manufacturing an organic electroluminescence device comprising a lower electrode, an organic light-emission medium and an upper electrode on a support substrate, wherein a drying step is carried out before and after forming of the organic light-emission medium or each occasion in order to keep that the water content of the organic light-emission medium after fabricating the organic electroluminescence device is 0.05 wt. % or less.

6. The method for manufacturing an organic electroluminescence device according to claim 5, wherein the dew point at the drying step is maintained at −10° C. or less.

7. The method for manufacturing an organic electroluminescence device according to claim 5, wherein the evacuated pressure at the drying step is 13.3 Pa or less.

8. The method for manufacturing an organic electroluminescence device according to claim 5, wherein the heating temperature at the drying step is from 60 to 300° C.

9. The method for manufacturing an organic electroluminescence device according to claim 5, wherein an inert gas is used at the drying step.

10. The method for manufacturing an organic electroluminescence device according to claim 6, wherein the heating temperature at the drying step is from 60 to 300° C.

11. The method for manufacturing an organic electroluminescence device according to claim 6, wherein an inert gas is used at the drying step.

12. The method for manufacturing an organic electroluminescence device according to claim 7, wherein the heating temperature at the drying step is from 60 to 300° C.

13. The method for manufacturing an organic electroluminescence device according to claim 7, wherein an inert gas is used at the drying step.

14. The method for manufacturing an organic electroluminescence device according to claim 5, wherein an apparatus comprising a drying unit, a deposition unit and a conveying unit between these units is used, the drying step for a substrate is carried out before and after a formation of the organic light-emission medium or each occasion in the drying unit, the conveying step of the substrate to the deposition unit is carried out by using a conveyer in the conveying unit, and the forming step of an organic light-emission medium is carried out in the deposition unit.

15. A method for manufacturing an organic electroluminescence device which is laminated an electroluminescence element comprising a lower electrode, an organic light-emission medium and an upper electrode on a support substrate with sealing parts having each or both of a color filter and a fluorescence medium on a sealing substrate, wherein a drying step is carried out for at least the organic light-emission medium and the sealing parts in order to keep that the water content of the organic light-emission medium after fabricating the organic electroluminescence device is 0.05 wt. % or less.

16. A method for manufacturing an organic electroluminescence device comprising a lower electrode, an organic light-emission medium and an upper electrode on a support substrate, wherein a drying step is carried out after forming of the organic light-emission medium by using a wetting process in order to keep that the water content of the organic light-emission medium after fabricating the organic electroluminescence device is 0.05 wt. % or less.

17. The method for manufacturing an organic electroluminescence device according to claim 16, wherein an apparatus comprising a drying unit, a deposition unit and a conveying unit between these units is used, the organic light-emission medium is formed by using a wetting process, the drying step for a substrate is carried out after a formation of the organic light-emission medium in the drying unit, a conveying step of the substrate to the deposition unit is carried out by using a conveyer in the conveying unit, and a forming step of an upper electrode is carried out in the deposition unit.

* * * * *